(12) United States Patent
Sato et al.

(10) Patent No.: US 9,023,668 B2
(45) Date of Patent: May 5, 2015

(54) METHOD FOR PRODUCING SUBSTRATE HAVING CONCAVITY AND CONVEXITY STRUCTURE AND METHOD FOR PRODUCING ORGANIC EL ELEMENT USING THE SAME

(71) Applicant: JX Nippon Oil & Energy Corporation, Tokyo (JP)

(72) Inventors: Yusuke Sato, Yokohama (JP); Suzushi Nishimura, Yokohama (JP)

(73) Assignee: JX Nippon Oil & Energy Corporation, Tokyo (JP)

( * ) Notice: Subject to any disclaimer, the term of this patent is extended or adjusted under 35 U.S.C. 154(b) by 0 days.

(21) Appl. No.: 14/029,371

(22) Filed: Sep. 17, 2013

(65) Prior Publication Data

US 2014/0030833 A1   Jan. 30, 2014

Related U.S. Application Data

(63) Continuation of application No. PCT/JP2012/057945, filed on Mar. 27, 2012.

(30) Foreign Application Priority Data

Mar. 28, 2011   (JP) .................................. 2011-070258

(51) Int. Cl.
*H01L 21/66* (2006.01)
*G01R 31/26* (2014.01)
(Continued)

(52) U.S. Cl.
CPC ............ *H01L 51/56* (2013.01); *H01L 51/0096* (2013.01); *H01L 51/5275* (2013.01);
(Continued)

(58) Field of Classification Search
USPC ......... 438/14, 16, 34; 257/E21.521, E21.525, 257/E21.529, E33.001
See application file for complete search history.

(56) References Cited

U.S. PATENT DOCUMENTS

| | | | |
|---|---|---|---|
| 2006/0279676 | A1 | 12/2006 | Masutani et al. |
| 2006/0279679 | A1 | 12/2006 | Fujisawa et al. |
| 2012/0132897 | A1 | 5/2012 | Seki et al. |

FOREIGN PATENT DOCUMENTS

| | | |
|---|---|---|
| JP | A-2000-321406 | 11/2000 |
| JP | A-2006-030621 | 2/2006 |

(Continued)

OTHER PUBLICATIONS

May 1, 2012 International Search Report issued in International Patent Application No. PCT/JP2012/057945 (with translation).
(Continued)

*Primary Examiner* — Calvin Choi
(74) *Attorney, Agent, or Firm* — Oliff PLC

(57) ABSTRACT

A method for producing a substrate having an irregular concave and convex surface for scattering light includes: manufacturing a substrate having the irregular concave and convex surface; irradiating the concave and convex surface of the manufactured substrate with inspection light from a direction oblique to a normal direction and detecting returning light of the inspection light returned from the concave and convex surface by a light-receiving element provided in the normal direction of the concave and convex surface; and judging unevenness of luminance of the concave and convex surface by an image processing device based on light intensity of the returning light received. An organic EL element which includes a diffraction-grating substrate having an irregular concave and convex surface is produced with a high throughput.

21 Claims, 19 Drawing Sheets

(51) Int. Cl.
*H01L 51/56* (2006.01)
*H01L 51/00* (2006.01)
*H01L 51/52* (2006.01)
*G02B 5/02* (2006.01)
*G02B 5/18* (2006.01)
*H05B 33/02* (2006.01)
*H05B 33/10* (2006.01)
*B82Y 20/00* (2011.01)

(52) U.S. Cl.
CPC .............. *B82Y 20/00* (2013.01); *G02B 5/0221* (2013.01); *G02B 5/0284* (2013.01); *G02B 5/1842* (2013.01); *Y02E 10/549* (2013.01); *H05B 33/02* (2013.01); *H05B 33/10* (2013.01)

(56) References Cited

FOREIGN PATENT DOCUMENTS

| | | |
|---|---|---|
| JP | A-2006-236748 | 9/2006 |
| KR | 20050061133 A | 6/2005 |
| WO | WO 2011/007878 A1 | 1/2011 |

OTHER PUBLICATIONS

Patent Examination Report No. 1 issued in Australian Patent Application No. 2012233865 dated May 7, 2014.
Extended European Search Report issued in European Patent Application No. 12764995.2 on Jul. 30, 2014.
International Preliminary Report on Patentability issued in International Patent Application No. PCT/JP2012/057945 on Oct. 1, 2013 (with translation).
Aug. 13, 2014 Office Action issued in Korean Patent Application No. 10-2013-7024220 (with translation).
Aug. 19, 2014 Office Action issued in Japanese Patent Application No. 2013-507617 (with translation).
Jan. 14, 2015 Office Action issued in Canadian Patent Application No. 2,830,078.
Feb. 2, 2015 Office Action issued in Korean Patent Application No. 10-2013-7024220.
Feb. 4, 2015 Office Action issued in Chinese Patent Application No. 201280016402.X.

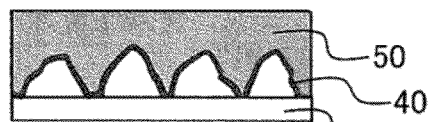
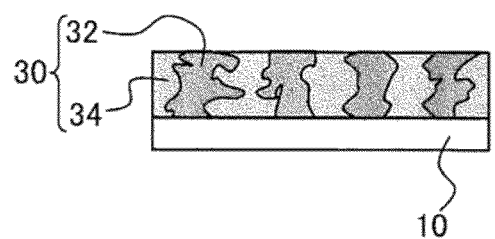
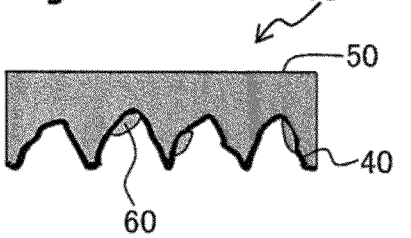
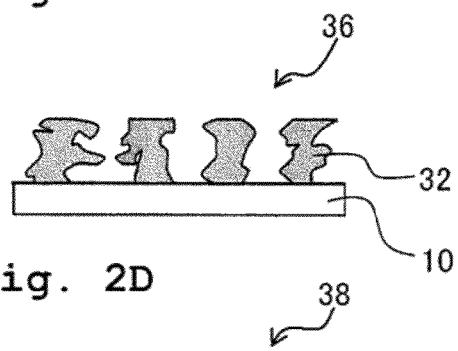
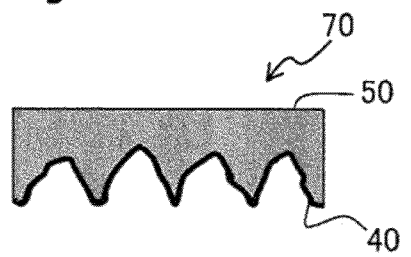
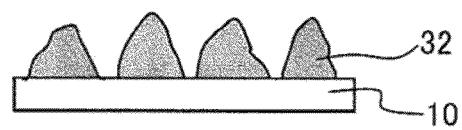
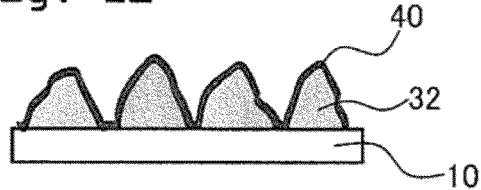

METHOD FOR PRODUCING SUBSTRATE HAVING CONCAVITY AND CONVEXITY STRUCTURE AND METHOD FOR PRODUCING ORGANIC EL ELEMENT USING THE SAME

CROSS REFERENCE TO RELATED APPLICATION

This application is a continuation application of International Patent Application No. PCT/JP2012/057945 filed on Mar. 27, 2012 claiming the benefit of priority of Japanese Patent Application No. 2011-070258 filed on Mar. 28, 2011. The contents of International Patent Application No. PCT/JP2012/057945 and Japanese Patent Application No. 2011-070258 are incorporated herein by reference in their entities.

BACKGROUND OF THE INVENTION

1. Field of the Invention

The present invention relates to a method for producing a substrate having irregular concavities and convexities used for production of an organic electro-luminescent element and the like and a method for producing an organic EL using the same.

2. Description of the Related Art

As a self-luminescent display element, there has been known an organic electro-luminescent element (also referred to as an organic light-emitting diode. Hereinbelow, referred to as an "organic EL element"). As compared with a liquid crystal element, the organic EL element has high visibility and does not need a backlight, and thus it is possible to reduce the weight thereof. For this reason, research and development of the organic EL element as the display element for the next generation has been actively carried out.

In the organic EL element, a hole injected from a hole injecting layer and electron injected from an electron injecting layer are carried to a light emitting layer respectively, then the hole and the electron are recombined on an organic molecule in the light emitting layer to excite the organic molecule, and thereby light emission occurs. Therefore, in a case that the organic EL element is used as a display device, the light from the light emitting layer is required to be efficiently extracted from the surface of the organic EL element. In order to meet this demand, Japanese Patent Application Laid-open No. 2006-236748 and the like disclose that a diffraction-grating substrate is provided on a light extraction surface of the organic EL element.

The applicant of the present invention discloses the following method in International Publication No. WO2011/007878A1. That is, a solution obtained by dissolving a block copolymer satisfying a predetermined condition into a solvent is applied on a base member, and drying is performed to form a micro phase separation structure of the block copolymer, thereby obtaining a master block (metal substrate) in which a minute or fine and irregular concavity and convexity pattern is formed. According to this method, it is possible to obtain the master block used for the nanoimprint and the like by using a self-organizing phenomenon of the block copolymer. A mixture of a silicone-based polymer and a curing agent is dripped onto the obtained master block and then cured to obtain a transferred pattern. Then, a glass substrate to which a curable resin has been applied is pressed against the transferred pattern and the curable resin is cured by irradiation with ultraviolet rays. In this way, a diffraction grating in which the transferred pattern is duplicated is manufactured. It has been confirmed that an organic EL element obtained by stacking a transparent electrode, an organic layer, and a metal electrode on the diffraction grating has sufficiently high light emission efficiency, sufficiently high level of external extraction efficiency, sufficiently low wavelength-dependence of light emission, sufficiently low directivity of light emission, and sufficiently high power efficiency.

It is desired that even the organic EL element in which the diffraction grating produced in International Publication No. WO2011/007878A1 as described above is used emits light at a uniform luminance from the entire display surface(s) in a case that the organic EL element is used as the display device and/or the illumination device of a cellular or mobile phone, a television screen, and the like. Thus, it is necessary to confirm whether or not the irradiation or emission from the organic EL element is uniform, that is, whether unevenness of luminance is within an acceptable range, after completion of the organic EL element. In a case that the unevenness of luminance of the completed organic EL element is judged to be beyond the acceptable range, the organic EL element is determined to be a unsatisfactory or defective product, and a step for stacking many layers on the diffraction grating as described above goes to waste. Especially, stacking of the transparent electrode, the organic layer, the metal electrode, and the like is a complex or time-consuming process requiring a high production cost. Therefore, it is strongly desired that the number of such the unsatisfactory or defective products is reduced to improve the yield rate, and thereby reducing the waste of the material and the production cost.

In view of the above, an object of the present invention is to provide a method for producing an organic EL element which includes a diffraction-grating substrate having an irregular concave and convex surface with a high throughput. Further, another object of the present invention is to provide a method for producing a substrate having an irregular concave and convex surface which is used as an optical component, the method including a step for evaluating unevenness of luminance of the substrate.

SUMMARY OF THE INVENTION

According to the present invention, there is provided a method for producing a substrate having an irregular concave and convex surface for scattering light, including:
  manufacturing the substrate having the irregular concave and convex surface;
  irradiating the concave and convex surface of the manufactured substrate with inspection light from a direction oblique to a normal direction of the concave and convex surface, and detecting returning light of the inspection light returned from the concave and convex surface by a light-receiving element provided in the normal direction of the concave and convex surface; and
  judging unevenness of luminance of the concave and convex surface based on light intensity of the received returning light.

In the method for producing the substrate of the present invention, any method in which phase separation of the block copolymer is utilized can be adopted as the method for manufacturing the substrate having the irregular concave and convex surface. The method for manufacturing the substrate having the irregular concave and convex surface is exemplified by a method in which the phase separation of the block copolymer is promoted by heat or solvent vapor. In a case of the phase separation due to heat, the method may include: a step of applying a block copolymer solution of a block copolymer made of at least a first polymer and a second polymer on a surface of a base member to form a coating film;

a step of drying the coating film on the base member; a first heating step for heating the coating film after the drying at a temperature higher than a glass transition temperature of the block copolymer of the block copolymer solution (step of performing the phase separation of the block copolymer); and an etching step for etching the coating film after the first heating step to remove the second polymer so that a concavity and convexity structure is formed on the base member. Further, the method may include a second heating step of heating the concavity and convexity structure, for which the etching has been performed in the etching step, at a temperature higher than a glass transition temperature of the first polymer. Furthermore, the method may include: a step of forming a seed layer on the concavity and convexity structure after the second heating step; a step of stacking a metal layer on the seed layer by electroforming; and a step of peeling off the base member having the concavity and convexity structure from the metal layer and the seed layer to obtain a metal substrate. By performing the second heating step, each convex portion in the concavity and convexity structure develops into a chevron shape. Thus, even in a case that the metal layer as a mold is stacked on the concavity and convexity structure by the electro forming, the metal layer can be peeled off from the concavity and convexity structure easily. The obtained metal substrate may be a substrate having the irregular concave and convex surface. Alternatively, the substrate having the irregular concave and convex surface may be obtained as follows. That is, the obtained metal substrate is pressed to a transparent substrate to which a curable resin has been applied; the curable resin is cured; and the metal substrate is detached. Or, the substrate having the irregular concave and convex surface made of a sol-gel material may be obtained as follows. That is, the obtained metal substrate is pressed to a substrate to which a curable resin has been applied; the curable resin is cured; the metal substrate is detached to form a substrate having a concavity and convexity structure on the substrate; the substrate having the concavity and convexity structure is pressed onto a transparent substrate to which the sol-gel material has been applied; the so-gel material is cured; and the substrate is detached.

A micro phase separation structure of the block copolymer may be generated in the drying step or the first heating step, and the micro phase separation structure preferably has a lamellar form.

In the method for producing the substrate of the present invention, the manufacturing the substrate having the irregular concave and convex surface may include: a step of forming a vapor-deposited film on a surface of a polymer film, which is made of a polymer of which volume changes by heat, under a temperature condition of 70 degrees Celsius or above, and then cooling the polymer film and the vapor-deposited film to form concavities and convexities of wrinkles in a surface of the vapor-deposited film; a step of attaching a master block material on the vapor-deposited film; a step of curing the master block material; and a step of detaching the master block material after the curing from the vapor-deposited film to obtain a master block. The irregular concave and convex surface can be manufactured effectively in such a method as well. In this case, the polymer of which volume changes by heat may be a silicone-based polymer.

In the method for producing the substrate of the present invention, irregular concavities and convexities of the irregular concave and convex surface have a pseudo periodic structure, and in a case that an average period of the concavities and convexities is denoted by d, and that central wavelength of the inspection light is denoted by $\lambda$, the average period d and the central wavelength $\lambda$ preferably satisfy $0.5\,d \le \lambda \le 2.0\,d$.

Further, the inspection light is desirably a light of a blue band. Furthermore, the concave and convex surface is preferably irradiated with the inspection light so that an incident angle $\alpha$, which is oblique to the normal direction of the concave and convex surface, is $30° < \alpha < 90°$.

In the method for producing the substrate of the present invention, the light-receiving element may be an imaging device, and a maximum value and a minimum value of the returning light intensity may be obtained from output of each pixel of the imaging device to judge whether or not maximum value/minimum value is less than 1.5. In accordance with this reference or criterion, it is possible to judge the unevenness of luminance of the substrate effectively.

In the method for producing the substrate of the present invention, the substrate having the irregular concave and convex surface may be a film-shaped substrate (for example, a film-shaped substrate made of resin) or a glass substrate. The film-shaped substrate or the glass substrate may be irradiated with the inspection light while being moved continuously relative to the inspection light. Accordingly, it is possible to continuously and efficiently produce the substrate by using a line facility.

In the method for producing the substrate of the present invention, the irregular concave and convex surface may be formed of metal, resin, or a sol-gel material.

According to the second aspect of the present invention, there is provided a method for producing an organic EL element, including: manufacturing a diffraction-grating substrate having a concave and convex surface by using the method for producing the substrate of the present invention; and stacking a transparent electrode, an organic layer, and a metal electrode on the concave and convex surface of the diffraction-grating substrate sequentially to produce the organic EL element. In the method for producing the organic EL element, only in a case that it is judged that unevenness of luminance of the manufactured diffraction-grating substrate is within a predetermined range, the transparent electrode, the organic layer, and the metal electrode can be stacked sequentially on the concave and convex surface of the diffraction-grating substrate having the unevenness of luminance within the predetermined range to produce the organic EL element. Accordingly, the diffraction-grating substrate having a high degree of unevenness of luminance can be excluded in advance, and the organic EL element generating a uniform illumination intensity can be produced with a high throughput. Whether or not the unevenness of luminance of the manufactured diffraction-grating substrate is within the predetermined range can be judged as follows. That is, a maximum value and a minimum value of the returned light intensity are obtained from output of each pixel of an imaging device used as a light-receiving element, and it is judged whether or not maximum value/minimum value is less than 1.5.

According to a method for producing a substrate of the present invention, a substrate having an irregular concavity and convexity structure which is used for an element such as an organic EL element can be produced efficiently, while unevenness of luminance of the substrate having the irregular concavity and convexity structure is measured effectively. According to a method for producing the organic EL element of the present invention, the organic EL element can be produced with a high throughput by associating property of the unevenness of luminance of the organic EL element with property of the unevenness of luminance of the substrate having the irregular concave and convex surface which is used for the organic EL element. Especially, since prediction of occurrence of the unevenness of luminance of the completed organic EL element and evaluation of the completed organic EL element can be performed in the production step of the substrate, it is possible to further reliably produce the organic EL element having a uniform illumination intensity by using a substrate which passed the judgment of the unevenness of luminance or which was judged to have a satisfactory or acceptable unevenness of luminance. Further, even in a case that the uniformity of the illumination intensity (unevenness of luminance) of the organic EL element is unsatisfactory, since it can be determined whether the defect occurred at a substrate formation stage or a formation stage of the element itself, it is possible to respond such a situation rapidly.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 2A-2H schematically show a process for manufacturing the substrate in accordance with BCP method.

DESCRIPTION OF THE PREFERRED EMBODIMENTS

In the following, preferred embodiments of a method for producing a substrate and a method for producing an organic EL according to the present invention will be described in detail with reference to the drawings.

Figure 1:
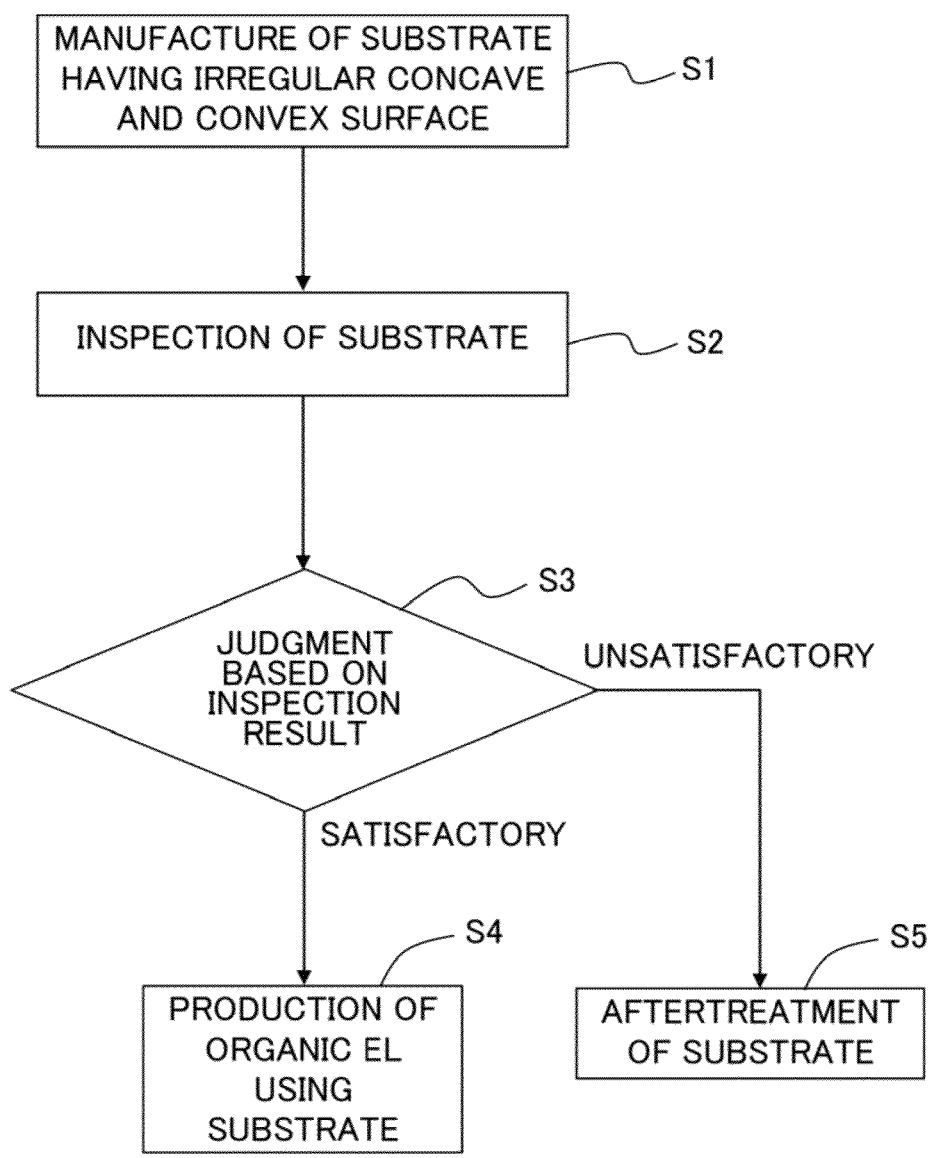
FIG. 1 is a flowchart showing a method for producing a substrate of the present invention.

The outline of the method for producing the substrate and the method for producing the organic EL according to the present invention is shown in the flowchart of FIG. 1. At first, a substrate having an irregular concavity and convexity structure is produced in accordance with a substrate manufacturing step exemplified below (S1). Next, luminance of the surface of the obtained substrate is inspected in accordance with an inspection step as will be described later on (S2). The inspection result is subjected to a judgment in which it is judged whether or not the substrate has a uniform luminance distribution in accordance with a predetermined judgment step which will be described later (S3). In a case that it is judged that the substrate has the uniform luminance distribution, the organic EL is produced using the substrate (S4). In a case that it is not judged that the substrate has the uniform luminance distribution, an aftertreatment as will be described later on is performed (S5). In the following, an explanation will be made about each of the steps with reference to drawings.

1. Step of Manufacturing Substrate

According to the method for producing the substrate of the present invention, a substrate having an irregular concave and convex surface is manufactured. The "substrate having an irregular concave and convex surface" refers to a substrate in which a concavity and convexity pattern formed therein has no regularity, in particular, a substrate in which pitches of concavities and convexities are ununiform and orientations of the concavities and convexities have no directivity. The light scattered and/or diffracted on such a substrate is not light having single wavelength or wavelength having a narrow band. The light scattered and/or diffracted on such a substrate has a range of wavelength relatively broad, has no directivity, and is directed in various directions. However, the "substrate having an irregular concave and convex surface" includes a pseudo periodic structure such as that in which a Fourier-transformed image, which is obtained by performing a two-dimensional fast Fourier-transform processing on an concavity and convexity analysis image obtained by analyzing a concavity and convexity shape on the surface, shows a circular or annular pattern, that is, such as that in which, although the orientations of the concavities and convexities have no directivity, the pitches of the concavities and convexities vary. Therefore, the substrate having such a pseudo periodic structure is suitable for a diffraction substrate used in a surface-emitting element and the like such as an organic EL element, provided that the substrate which has the distribution or variability in the pitch of the concavities and convexities diffracts visible light. On the other hand, a substrate, which is formed so that all of the recording tracks (groups) are aligned in the same direction at the same pitch, such as an optical recording medium and magnetic recording medium, is not included in an object of production according to the present invention.

In order to produce the substrate having the irregular concave and convex surface as described above, it is preferable to use a method of utilizing self-organization or assembly (micro phase separation) of a block copolymer described in Japanese Patent Application Laid-open No. 2011-006487 of the inventors of the present invention to be described below (hereinafter referred to as "BCP (Block Copolymer) method" as appropriate) or a method of heating and cooling a polymer film on a vapor-deposited film to form concavities and convexities of wrinkles on a surface of polymer disclosed in International Application No. PCT/JP2010/062110 (WO2011/007878A1) of the inventors of the present invention (hereinafter referred to as "BKL (Buckling) method" as appropriate). Each of the methods will be described below.

A. Production of Substrate by BCP Method

Figure 3A:
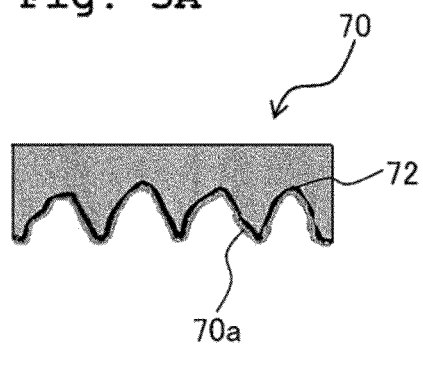
FIGS. 3A-3E schematically show a process for manufacturing the substrate after electroforming.
Figure 3D:
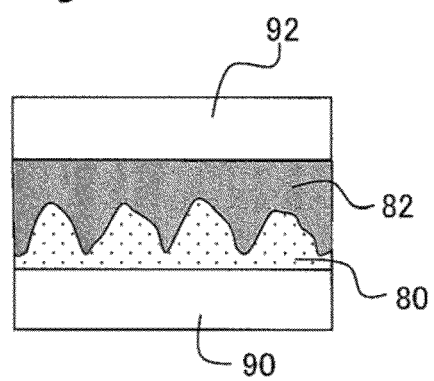
Figure 3B:
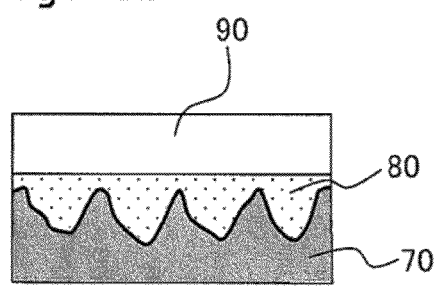
Figure 3E:
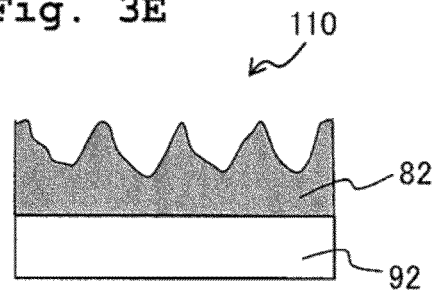
Figure 3C:
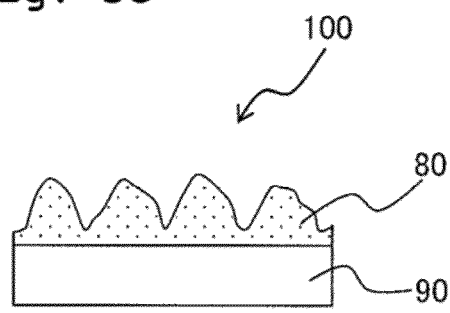
Figure 4:
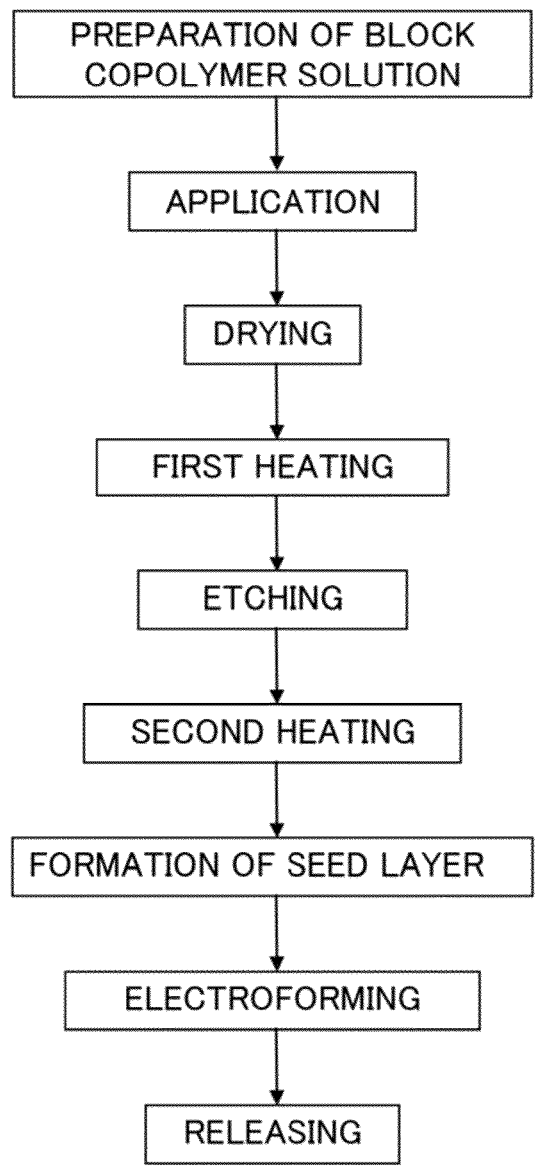
FIG. 4 is a flowchart showing the process for manufacturing the substrate in accordance with the BCP method.

An explanation will be made about the production of the substrate by the BCP method with reference to FIGS. 2 to 4.

<Preparation Step of Block Copolymer Solution>

The block copolymer used for the BCP method includes at least a first polymer segment made of a first homopolymer and a second polymer segment made of a second homopolymer different from the first homopolymer. The second homopolymer desirably has a solubility parameter which is higher than a solubility parameter of the first homopolymer by 0.1 to 10 $(cal/cm^3)^{1/2}$. In a case that the difference between the solubility parameters of the first and second homopolymers is less than 0.1 $(cal/cm^3)^{1/2}$, it is difficult to form a regular micro phase separation structure of the block copolymer. In a case that the difference exceeds 10 $(cal/cm^3)^{1/2}$, it is difficult to prepare a uniform solution of the block copolymer.

Examples of monomers serving as raw materials of homopolymers usable as the first homopolymer and second homopolymer include styrene, methylstyrene, propylstyrene, butylstyrene, hexylstyrene, octylstyrene, methoxystyrene, ethylene, propylene, butene, hexene, acrylonitrile, acrylamide, methyl methacrylate, ethyl methacrylate, propyl methacrylate, butyl methacrylate, hexyl methacrylate, octyl methacrylate, methyl acrylate, ethyl acrylate, propyl acrylate, butyl acrylate, hexyl acrylate, octyl acrylate, methacrylic acid, acrylic acid, hydroxyethyl methacrylate, hydroxyethyl acrylate, ethylene oxide, propylene oxide, dimethylsiloxane, lactic acid, vinylpyridine, hydroxystyrene, styrenesulfonate, isoprene, butadiene, ε-caprolactone, isopropylacrylamide, vinyl chloride, ethylene terephthalate, tetrafluoroethylene, and vinyl alcohol. Of these monomers, styrene, methyl methacrylate, ethylene oxide, butadiene, isoprene, vinylpyridine, and lactic acid are preferably used from the viewpoints that the formation of phase separation easily occurs, and that the concavities and convexities are easily formed by an etching.

In addition, examples of a combination of the first homopolymer and the second homopolymer include combinations of two selected from the group consisting of a styrene-based polymer (more preferably polystyrene), polyalkyl methacrylate (more preferably polymethyl methacrylate), polyethylene oxide, polybutadiene, polyisoprene, polyvinylpyridine, and polylactic acid. Of these combinations, a combination of the styrene-based polymer and polyalkyl methacrylate, a combination of the styrene-based polymer and polyethylene oxide, a combination of the styrene-based polymer and polyisoprene, a combination of the styrene-based polymer and polybutadiene are more preferable, and the combination of the styrene-based polymer and polymethyl methacrylate, the combination of the styrene-based polymer and polyisoprene, the combination of the styrene-based polymer and polybutadiene are particularly preferable, from the viewpoint that the depths of the concavities and convexities formed in the block copolymer can be further increased by preferentially removing one of the homopolymers by the etching process. A combination of polystyrene (PS) and polymethyl methacrylate (PMMA) is further preferable.

The number average molecular weight (Mn) of the block copolymer is preferably 500,000 or more, and is more preferably 1,000,000 or more, and particularly preferably 1,000,000 to 5,000,000. In a case that the number average molecular weight is less than 500,000, the average pitch of the concavities and convexities formed by the micro phase separation structure of the block copolymer is so small that the average pitch of the concavities and convexities of the obtained diffraction grating becomes insufficient. Especially, in a case of the diffraction grating used for the organic EL, since the diffraction grating needs to diffract illumination light over a range of wavelength of a visible region, the average pitch is desirably 100 to 600 nm, and thus the number average molecular weight (Mn) of the block copolymer is preferably 500,000 or more. Further, according to experiments conducted by the applicant, it has been appreciated that, in a case that the number average molecular weight (Mn) of the block copolymer is 500,000 or more, it is difficult to obtain a desired concavity and convexity pattern by an electroforming, unless the second heating step is performed after the etching step, as it will be described later.

The molecular weight distribution (Mw/Mn) of the block copolymer is preferably 1.5 or less, and is more preferably 1.0 to 1.35. In a case that the molecular weight distribution exceeds 1.5, it is not easy to form the regular micro phase separation structure of the block copolymer.

Note that the number average molecular weight (Mn) and the weight average molecular weight (Mw) of the block copolymer are values measured by gel permeation chromatography (GPC) and converted to molecular weights of standard polystyrene.

In the block copolymer, a volume ratio between the first polymer segment and the second polymer segment (the first polymer segment: the second polymer segment) is desirably 3:7 to 7:3 in order to create a lamellar structure by self-organization or assembly, and is more preferably 4:6 to 6:4. In a case that the volume ratio is out of the above-described range, a concavity and convexity pattern owing to the lamellar structure is difficult to form.

The block copolymer solution used in the BCP method is prepared by dissolving the block copolymer in a solvent. Examples of the solvent include aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycol ethers such as ethylene glycol dimethyl ether, diethylene glycol dimethyl ether, triglyme, propylene glycol monomethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; and mixture solvents thereof. A percentage content of the block copolymer in the block copolymer solution is preferably 0.1 to 15% by mass, and more preferably 0.3 to 5% by mass, relative to 100% by mass of the block copolymer solution.

In addition, the block copolymer solution may further include a different homopolymer (a homopolymer other than the first homopolymer and the second homopolymer in the block copolymer contained in the solution: for example, when the combination of the first homopolymer and the second homopolymer in the block copolymer is the combination of polystyrene and polymethyl methacrylate, the different homopolymer may be any kind of homopolymer other than polystyrene and polymethyl methacrylate), a surfactant, an ionic compound, an anti-foaming agent, a leveling agent, and the like.

By containing the different homopolymer, the micro phase separation structure of the block copolymer can be improved. For example, polyalkylene oxide can be used to increase the depths of the concavities and convexities formed by the micro phase separation structure. As the polyalkylene oxide, polyethylene oxide or polypropylene oxide is more preferable, and polyethylene oxide is particularly preferable. In addition, as the polyethylene oxide, one represented by the following formula is preferable:

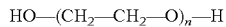

$$\text{HO}-(\text{CH}_2-\text{CH}_2-\text{O})_n-\text{H}$$

[in the formula, "n" represents an integer of 10 to 5000 (more preferably an integer of 50 to 1000, and further preferably an integer of 50 to 500)]. In a case that the value of n is less than the lower limit, the molecular weight is so low that the effect obtained by containing the different homopolymer becomes insufficient, because the polyethylene oxide is lost due to volatilization, vaporization, or the like during a heating process at a high-temperature. In a case that the value exceeds the upper limit, the molecular weight is so high that the molecular mobility is low. Hence, the speed of the phase separation is lowered, and the formation of the micro phase separation structure is adversely affected.

In addition, the number average molecular weight (Mn) of the different homopolymer is preferably 460 to 220,000, and is more preferably 2,200 to 46,000. In a case that the number average molecular weight is less than the lower limit, the molecular weight is so low that the effect obtained by containing the different homopolymer becomes insufficient, because the different homopolymer is lost due to volatilization, vaporization, or the like during the heating process at the high-temperature. In a case that the number average molecular weight exceeds the upper limit, the molecular weight is so high that the molecular mobility is low. Hence, the speed of the phase separation is lowered, and the formation of the micro phase separation structure is adversely affected.

The molecular weight distribution (Mw/Mn) of the different homopolymer is preferably 1.5 or less, and more preferably 1.0 to 1.3. In a case that the molecular weight distribution exceeds the upper limit, uniformity of the shape of the micro phase separation is less likely to be maintained. Note that the number average molecular weight (Mn) and the weight average molecular weight (Mw) are values measured by gel permeation chromatography (GPC) and converted to molecular weights of standard polystyrene.

In addition, in a case that the different homopolymer is used in the BCP method, it is preferable that the combination of the first homopolymer and the second homopolymer in the block copolymer be the combination of polystyrene and polymethyl methacrylate (polystyrene-polymethyl methacrylate), and that the different homopolymer be a polyalkylene oxide. By using a polystyrene-polymethyl methacrylate block copolymer and polyalkylene oxide in combination as described above, the orientation in the vertical direction is further improved, thereby making it possible to further increase the depths of the concavities and convexities on the surface, and to shorten the heating process time during the manufacture.

In a case that the different homopolymer is used, the content thereof is preferably 100 parts by mass or less, and more preferably 5 parts by mass to 100 parts by mass, relative to 100 parts by mass of the block copolymer. In a case that the content of the different homopolymer is less than the lower limit, the effect obtained by containing the different homopolymer becomes insufficient.

In a case that the surfactant is used, the content thereof is preferably 10 parts by mass or less relative to 100 parts by mass of the block copolymer. Moreover, in a case that the ionic compound is used, the content thereof is preferably 10 parts by mass or less relative to 100 parts by mass of the block copolymer.

In a case that the block copolymer solution contains the different homopolymer, the total percentage content of the block copolymer and the different homopolymer is preferably 0.1 to 15% by mass, and more preferably 0.3 to 5% by mass, in the block copolymer solution. In a case that the total percentage content is less than the lower limit, it is difficult to uniformly apply the solution to attain a film thickness sufficient to obtain a necessary film thickness. In a case that the total percentage content exceeds the upper limit, it is relatively difficult to prepare a solution in which the block copolymer and the different homopolymer are uniformly dissolved in the solvent.

<Application Step of Block Copolymer Solution>

According to the method for producing the substrate using the BCP method, as shown in FIG. 2A, the block copolymer solution prepared as described above is applied on a base member 10 to form a thin film 30. The base member 10 is not especially limited, and is exemplified, for example, by substrates of resins such as polyimide, polyphenylene sulfide (PPS), polyphenylene oxide, polyether ketone, polyethylene naphthalate, polyethylene terephthalate, polyarylate, triacetyl cellulose, and polycycloolefin; inorganic substrates such as glass, octadecyldimethyl chlorosilane (ODS) treated glass, octadecyl trichlorosilane (OTS) treated glass, organo silicate treated glass, and silicon substrates; and substrates of metals such as aluminum, iron, and copper. In addition, the base member 10 may be subjected to a surface treatment such as an orientation treatment, etc. By performing treatment on the surface of the substrate such as the glass with ODS, organo silicate, or the like, the micro phase separation structure such as the lamellar structure, a cylinder structure, and a globular or spherical structure is more likely to be arranged perpendicular to the surface in a heating step as will be described later on. The reason thereof is that domain of each block forming the block copolymer is more likely to be perpendicularly-oriented by decreasing the difference in interface energy between each block copolymer component and the surface of the substrate.

The method for applying the block copolymer solution is not particularly limited, and, for example, a spin coating method, a spray coating method, a dip coating method, a dropping method, a gravure printing method, a screen printing method, a relief printing method, a die coating method, a curtain coating method, or an ink-jet method can be employed as the method.

The thickness of the thin film 30 of the block copolymer is preferably within a range which allows the thickness of a dried coating film, as will be described later, to be 10 to 3000 nm, and more preferably within a range which allows the thickness of the dried coating film to be 50 to 500 nm.

<Drying Step>

After the block copolymer solution is applied on the base member 10 to form the thin film 30, the thin film 30 on the base member 10 is dried. The drying can be performed in the ambient atmosphere. The temperature for drying the thin film 30 is not particularly limited, provided that the solvent can be removed from the thin film 30. For example, the temperature is preferably 30 degrees Celsius to 200 degrees Celsius, and more preferably 40 degrees Celsius to 100 degrees Celsius. It is noted that concavities and convexities are found, in some cases, on the surface of the thin film 30 when the formation of the micro phase separation structure of the block copolymer is started during the drying step.

<First Heating Step>

After the drying step, the thin film 30 is heated at a temperature of not less than a glass transition temperature (Tg) of the block copolymer (first heating step or annealing process). The heating step (an example of a step of generating the micro phase separation structure) promotes the self-organization or assembly of the block copolymer, and the micro phase separation of the block copolymer into portions of a first polymer segment 32 and second polymer segment 34 occurs as shown in FIG. 2B. In a case that the heating temperature is less than the glass transition temperature of the block copolymer, the molecular mobility of the polymer is so low that the self-organization or assembly of the block copolymer does not make progress adequately and thus the micro phase separation structure can not be formed enough or the heating time required for sufficiently generating the micro phase separation structure is long. In addition, the upper limit of the heating temperature is not particularly limited, unless the block copolymer is pyrolyzed at the temperature. The first heating step can be performed in the ambient atmosphere using an oven or the like. The drying step and the heating step can be performed continuously by gradually increasing the heating temperature. Accordingly, the drying step is included in the heating step.

<Etching Step>

After the first heating step, the etching process of the thin film 30 is performed. Since the molecular structure of the first polymer segment 32 is different from the molecular structure of the second polymer segment 34, etchability of the first polymer segment 32 is also different from that of the second polymer segment 34. Therefore, by performing the etching process depending on each type of the polymer segments, that is, depending on each type of homopolymer, it is possible to selectively remove one of the polymer segments (second polymer segment 34) forming the block copolymer. A remarkable concavity and convexity structure appears on the coating film by removing each second polymer segment 34 from the micro phase separation structure in the etching process. As the etching process, an etching method using a reactive ion etching method, an ozone oxidation method, a hydrolysis method, a metal ion staining method, an ultraviolet-ray etching method, or the like can be employed. Moreover, as the etching process, a method may be employed in which covalent bonds in the block copolymer are cleaved by treating the covalent bonds with at least one selected from the group consisting of acids, bases, and reducing agents, and then the coating film in which the micro phase separation structure is formed is cleaned with a solvent which dissolves only one of the polymer segments, or the like, thereby removing only the one of the polymer segments, while keeping the micro phase separation structure. In the embodiments which will be described later, the ultraviolet-ray etching is used in view of operability and the like.

<Second Heating Step>

The second heating process or the annealing process is performed to a concavity and convexity structure 36 of the thin film 30 obtained by the etching step. The heating temperature in the second heating process is desirably not less than the glass transition temperature of the first polymer segment 32 remaining after the etching, that is, not less than the glass transition temperature of the first homopolymer. For example, the heating temperature in the second heating process is desirably not less than the glass transition temperature of the first homopolymer and not more than a temperature higher than the glass transition temperature of the first homopolymer by 70 degrees Celsius. In a case that the heating temperature is less than the glass transition temperature of the first homopolymer, it is not possible to obtain a desired concavity and convexity structure (that is, a smooth chevron structure) after the electroforming, or a long time is required to perform the heating. In a case that the heating temperature is much higher than the glass transition temperature of the first homopolymer, the first polymer segment 32 is melted and/or the shape of the first polymer segment 32 is collapsed severely. Thus, it is not preferable. In view of the above, the heating is desirably performed within a range from the glass transition temperature to the temperature higher than the glass transition temperature by about 70 degrees Celsius. Similar to the first heating process, the second heating process can be performed in the ambient atmosphere using the oven or the like.

According to experiments conducted by the inventors of the present invention, it has been found out that a desired transfer pattern is hardly obtained in case that the concavity and convexity structure 36 of the coating film obtained by the etching step is used as a master (master block) to transfer the concavity and convexity structure to a metallic mold by the electroforming which will be described later. Especially, this problem becomes conspicuous as the molecular weight of the block copolymer is higher. As described above, the molecular weight of the block copolymer is deeply linked with the micro phase separation structure, and thus the pitch of the diffraction grating obtained therefrom. Therefore, in a case that the diffraction grating is used for a purpose such as the organic EL element, a distribution of the pitch is required to be such that diffraction occurs in a wavelength region such as the visible region including a wavelength range which is wide and includes relatively long wavelength. In order to realize this, even in a case that a block copolymer having a relatively high molecular weight is used, it is necessary to reliably obtain, by the electroforming, a concavity and convexity structure having the desired pitch distribution. In the present invention, by performing the heating process for the concavity and convexity structure obtained by the etching, a metal substrate (mold), in which the concavity and convexity structure is also reflected enough, is successfully obtained in the subsequent electroforming step.

The reason thereof is considered by the inventors as follows. The concavity and convexity structure 36 after the etching is considered to have a complicated cross-section structure, in which the side surfaces of grooves defined by the concavity and convexity structure are coarse and the concavities and convexities (including the overhang) are generated in a direction perpendicular to a thickness direction. The following three problems are arisen by the complicated cross-section structure.

i) In the complicated cross-section structure, a portion at which a seed layer for the electroforming is not attached is generated, and thereby making it difficult to uniformly accumulate the metal layer by the electroforming. As a result, it is considered that the obtained metal substrate has low mechanical strength and that defects such as deformation of the metal substrate and pattern defect are caused.

ii) In the electroforming (electroplating), a thickness of plating varies depending on shapes of respective parts of an object to be subjected to the plating. In particular, a plated metal is more likely to be attracted to convex portions and projecting or prominent corners of the object, and is less likely to be attracted to concave portions and hollow portions of the object. Also for these reasons, it is difficult to obtain an electroformed film having a uniform film thickness on the complicated concave and convex cross-section structure after the etching.

iii) Even when the complicated cross-section structure as described above can be transferred to the metal substrate by the electroforming, in a case that an attempt is made to transfer the concavity and convexity shape by pressing the metal substrate against a curable resin, the curable resin enters into gaps in the complicated cross-section structure of the metal substrate. Hence, the metal substrate can not be released from the cured resin, or the pattern defect occurs by fracture of the portion of the metal substrate having the low strength. Conventionally, the transfer has been repeated using polydimethylsiloxane (PDMS) to prevent the above problem.

In the BCP method, the first polymer segment 32 constructing the side surfaces of the grooves is subjected to the annealing process by heating the concavity and convexity structure after the etching. Thereby, as shown in FIG. 2D conceptually, each cross-section shape defined by the first polymer segment 32 is formed of a relatively smooth and sloped surface to have a shape of chevron narrowing upward from the base member (referred to as "chevron-shaped structure" in this invention). The overhang does not appear in such a chevron-shaped structure, and the chevron-shaped structure is duplicated into the inverted pattern in a metal layer accumulated on the first polymer segment 32, thereby the metal layer can be released easily. It has become clear that the three problems can be solved by the effects of the second heating step as described above. According to the applicant of the present invention, it has been found out that the concavities and convexities are smooth, each convex portion has the smooth chevron shape, and no overhang is observed in a micrograph, taken by a scanning electron microscope (SEM), showing the cross-section structure of the metal substrate, which is formed by Ni-electroforming using the concavity and convexity structure obtained by the heating process after the etching process of the block copolymer. On the other hand, it has confirmed that Ni portions form grooves each having a complicated shape including an overhang structure and the resins are penetrated or entered into the grooves in a SEM micrograph showing the cross-section structure of the metal substrate, which is formed by the Ni-electroforming (nickel electroforming) using the concavity and convexity structure obtained without the second heating process after the etching process of the block copolymer.

The base member 10, which has a chevron-shaped structure 38 obtained in the second heating step, is used as a master for transfer in subsequent steps. The average pitch of the concavities and convexities representing the chevron-shaped structure 38 is preferably within a range from 100 to 600 nm, and more preferably 200 to 600 nm. In a case that the average pitch of the concavities and convexities is less than the lower limit, the pitches are so small relative to wavelengths of the visible light that required diffraction of the visible light is less likely to occur by using the diffraction grating obtained by use of such a master. In a case that the average pitch exceeds the upper limit, the diffraction angle of the diffraction grating obtained by use of such a master is so small that functions as the diffraction grating can not be fulfilled sufficiently. Note that for the average pitch of the concavities and convexities, a concavity and convexity analysis image is obtained by performing a measurement with an atomic force microscope in a randomly selected measuring region of 3 μm square (length: 3 μm, width: 3 μm) in the diffraction grating (details will be described later). The obtained concavity and convexity analysis image is subjected to a flattening process including primary inclination correction, and then subjected to two-dimensional fast Fourier transform processing. Thus, a Fourier-transformed image is obtained. For each of the points of Fourier-transformed image, intensity and distance (unit: $\mu m^{-1}$) from the origin of Fourier-transformed image are obtained. Then, the average value of the intensity is obtained for the points each having the same distance from the origin. As described above, a relation between the distance from the origin of the Fourier-transformed image and the average value of the intensity is plotted, a fitting with a spline function is carried out, and the wavenumber of peak intensity is regarded as the average wavenumber ($\mu m^{-1}$). For the average pitch, it is allowable to make a calculation by another method, for example, a method for obtaining the average pitch of the concavities and convexities as follows. That is, a concavity and convexity analysis image is obtained by performing a measurement in a randomly selected measuring region of 3 μm square (length: 3 μm, width: 3 μm) in the diffraction grating, then the distances between randomly selected adjacent convex portions or between randomly selected adjacent concave portions are measured at 100 points or more in the concavity and convexity analysis image, and then an average of these distances is determined.

In addition, the average height of the concavities and convexities representing the chevron-shaped structure 38 is preferably within a range from 5 to 200 nm, more preferably within a range from 20 to 200 nm, and further preferably within a range from 50 to 150 nm. In a case that the average height of the concavities and convexities is less than the lower limit, the height is so small relative to the wavelengths of the visible light that the diffraction is insufficient. In a case that the average height exceeds the upper limit, the following tendency is found. When the obtained diffraction grating is used as an optical element on the light extraction port side of the organic EL element, the element tends to be easily destructed and the life thereof tends to be shortened because of heat generation which occurs when the electric field distribution in the EL layer becomes non-uniform, and hence electric fields concentrate on a certain position or area. Note that the average height of the concavities and convexities refers to an average value of the heights of the concavities and convexities obtained when heights of the concavities and convexities (the distances between concave portions and convex portions in the depth direction) on the surface of the cured resin layer are measured. In addition, a value calculated as follows is employed as the average value of the heights of the concavities and convexities. That is, a concavity and convexity analysis image is obtained by measuring the shape of the concavities and convexities on the surface by use of the scanning probe microscope (for example, one manufactured by SII NanoTechnology Inc., under the product name of "E-sweep", or the like), then the distances between randomly selected concave portions and convex portions in the depth direction are measured at 100 points or more in the concavity and convexity analysis image, and then the average of the distances is determined as the average value of heights of concavities and convexities.

<Seed Layer Forming Step and Electroforming Step>

As shown in FIG. 2E, a seed layer 40 functioning as an electroconductive layer for a subsequent electroforming process is formed on the surface of the chevron-shaped structure 38 of the master obtained as described above. The seed layer 40 can be formed by non-electrolytic plating, sputtering, or vapor deposition. The thickness of the seed layer 40 is preferably not less than 10 nm and more preferably not less than 100 nm to uniformalize current density during the subsequent electroforming process, and thereby making the thickness of the metal layer accumulated by the subsequent electroforming process to be constant. As a material of the seed layer, it is possible to use, for example, nickel, copper, gold, silver, platinum, titanium, cobalt, tin, zinc, chrome, gold-cobalt alloy, gold-nickel alloy, boron-nickel alloy, solder, copper-nickel-chromium alloy, tin-nickel alloy, nickel-palladium alloy, nickel-cobalt-phosphorus alloy, or alloy thereof. It is considered that the relatively smooth chevron-shaped structure as shown in FIG. 2D is more likely to be attached to the seed layer completely and with a uniform thickness, compared with the complicated cross-section structure as shown in FIG. 2C.

Subsequently, the metal layer is accumulated on the seed layer 40 by the electroforming (electroplating) shown in FIG. 2F. The entire thickness of a metal layer 50 including the thickness of the seed layer 40 can be, for example, 10 to 3000 μm. As a material of the metal layer 50 accumulated by the electroforming, it is possible to use any of metal species as described above which can be used as the seed layer 40. In view of wear resistance and peeling property of the metal substrate as the mold, nickel is preferable. In this case, nickel is also preferably used for the seed layer 40. The current density during the electroforming may be, for example, 0.03 to 10 A/cm$^2$ for suppressing bridge to form a uniform metal layer and in view of shortening of an electroforming time. Considering ease of the subsequent processes such as pressing to the resin layer, peeling, and cleaning, the formed metal layer 50 desirably has appropriate hardness and thickness. A diamond like carbon (DLC) process or a Cr plating processing treatment can be performed on the surface of the metal layer in order to improve the hardness of the metal layer formed by the electroforming. Alternatively, the hardness of the surface may be improved by further performing the heating process of the metal layer.

<Peeling Step>

The metal layer 50 including the seed layer obtained as described above is peeled off from the base member having the concavity and convexity structure to obtain a metal substrate as a father die. As a peeling method, the metal layer 50 may be peeled off physically, or the first homopolymer and the remained block copolymer may be dissolved to be removed by using an organic solvent dissolving them, such as toluene, tetrahydrofuran (THF), and chloroform.

<Cleaning Step>

In a case that the metal substrate is peeled off from the base member 10 having the chevron-shaped structure 38 as described above, a part of the polymer 60, like the first polymer segment, remains in the metal substrate in some cases as shown in FIG. 2G. In such a case, each part 60 remained in the metal substrate can be removed by a cleaning. As a cleaning method, a wet cleaning or a dry cleaning can be used. As the wet cleaning, the remained parts can be removed by performing the cleaning with the organic solvent such as toluene and tetrahydrofuran, the surfactant, or an alkaline solution. In a case that the organic solvent is used, an ultrasonic cleaning may be carried out. Alternatively, the remained parts may be removed by performing an electrolytic cleaning. As the dry cleaning, the remained parts can be removed by an ashing using ultraviolet rays and/or plasma. The wet cleaning and the dry cleaning may be used in combination. After the cleaning as described above, a rinse process with pure water or purified water may be performed, and then ozone irradiation may be carried out after a drying. Accordingly, a metal substrate (mold) 70 having a desired concavity and convexity structure is obtained (FIG. 2H).

Next, an explanation will be made about a method for producing the diffraction grating used for the organic EL element and the like using the obtained metal substrate 70 with reference to FIG. 3A to FIG. 3E.

<Mold-Release Treatment Step of Metal Substrate>

In a case that the concavity and convexity structure is transferred to the resin using the metal substrate 70 as the mold, a mold-release treatment of the metal substrate 70 may be performed to improve the mold releasability from the resin. As the mold-release treatment, a manner to decrease surface energy is commonly used, and the mold-release treatment is not particularly limited and includes, for example, a method in which a concave and convex surface 70a of the metal substrate 70 is coated with a mold-release agent such as a fluorine-based material and a silicon resin as shown in FIG. 3A, a method in which the surface is subjected to a treatment using a fluorine-based silane coupling agent, and a method in which a film of a diamond like carbon is formed on the surface.

<Step for Transferring Metal Substrate to Resin Layer>

By using the obtained metal substrate 70, a mother die is produced by transferring the concavity and convexity structure (pattern) of the metal substrate to a resin layer 80. As the method of the transfer process, for example, a curable resin is applied on a transparent supporting substrate 90, and then the resin layer 80 is cured while pressing the concavity and convexity structure of the metal substrate 70 against the resin layer 80, as shown in FIG. 3B. The transparent supporting substrate 90 is exemplified, for example, by base members made of a transparent inorganic substance such as glass; base members made of a resin such as polyethylene terephthalate (PET), polyethylene terenaphthalate (PEN), polycarbonate (PC), cycloolefin polymer (COP), polymethyl methacrylate (PMMA), or polystyrene (PS); stacked base members each having a gas barrier layer made of an inorganic substance such as SiN, SiO$_2$, SiO$_x$N$_y$, TiO$_2$, or Al$_2$O$_3$ formed on the surface of the base member made of any one of the above-described resins; and stacked base members each having base members made of any one of the above-described resins and gas barrier layers made of any one of the above-described inorganic substances stacked alternately on each other. In addition, the thickness of the transparent supporting substrate may be within a range from 1 to 500 μm.

Examples of the curable resin include epoxy resin, acrylic resin, urethane resin, melamine resin, urea resin, polyester resin, phenol resin, and cross-linking type liquid crystal resin. The thickness of the cured resin is preferably within a range from 0.5 to 500 μm. In a case that the thickness is less than the lower limit, heights of the concavities and convexities formed on the surface of the cured resin layer are more likely to be insufficient. In a case that the thickness exceeds the upper limit, an effect of volume change of the resin which occurs upon curing is likely to be so large that the formation of the shape of the concavities and convexities tends to be insufficient.

As a method for applying the curable resin, it is possible to adopt various coating methods such as a spin coating method, a spray coating method, a dip coating method, a dropping method, a gravure printing method, a screen printing method, a relief printing method, a die coating method, a curtain coating method, an ink-jet method, and a sputtering method. Moreover, the condition for curing the curable resin varies depending on the kind of the resin used. For example, a curing temperature is preferably within a range from room temperature to 250 degrees Celsius, and a curing time is preferably within a range from 0.5 minutes to 3 hours. Alternatively, a method may be employed in which the curable resin is cured by irradiation with energy rays such as ultraviolet rays or electron beams. In such a case, the amount of the irradiation is preferably within a range from 20 mJ/cm$^2$ to 5 J/cm$^2$.

Subsequently, the metal substrate 70 is detached from the cured rein layer 80 in a cured state. A method for detaching the metal substrate 70 is not limited to a mechanical peeling method, and can adopt any known method. Then, as shown in FIG. 3C, it is possible to obtain a resin film structure 100 in which the cured rein layer 80 having the concavities and convexities is formed on the transparent supporting substrate 90. The resin film structure 100 may be used, as it is, as the diffraction grating.

The method for producing the substrate according to the BCP method can be used not only in production of the diffraction grating provided on the light extraction port side of the organic EL element but also in production of an optical component having a minute or fine pattern used for various devices. For example, the method for producing the substrate according to the BCP method can be used to produce a wire grid polarizer, an antireflection film, or an optical element for providing a light confinement effect in a solar cell by being placed on the photoelectric conversion surface side of the solar cell.

As described above, the resin film structure 100 having a desired pattern can be obtained. In a case that the inverted pattern of the resin film structure 100 is used as the diffraction grating, the resin film structure 100 obtained through the transfer process of the metal substrate as described above is used as the mother die; a curable resin layer 82 is applied on another transparent supporting substrate 92 as shown in FIG. 3D; and the curable resin layer 82 is cured while pressing the resin film structure 100 against the curable resin layer 82, similar to a case in which the resin film structure 100 is formed. Subsequently, the resin film structure 100 is peeled off from the curable resin layer 82 in a cured state. Accordingly, a replica 110 as another resin film structure as shown in FIG. 3E can be obtained. Further, it is allowable to produce a replica having the inverted pattern of the replica 110 by performing the above transfer step using the replica 110 as a master and/or to produce a sub-replica by repeating the above transfer step again using the replica having the inverted pattern as the master.

Next, an explanation will be made about a method for manufacturing a structure having concavities and convexities made of the sol-gel material (hereinafter referred to as "sol-gel structure" or "sol-gel substrate" as appropriate) by further using the obtained resin film structure 100 as the master. A method for forming a substrate having a concavity and convexity pattern using the sol-gel material mainly includes: a solution preparation step for preparing a sol solution; an application step for applying the prepared sol solution on the substrate; a drying step for drying the coating film of the sol solution applied on the substrate; a pressing step for pressing a mold with a transfer pattern; a pre-sintering step during which the coating film to which the mold is pressed is subjected to the pre-sintering; a peeling step for peeling off the mold from the coating film; and a main sintering step during which the coating film is subjected to the main sintering. Hereinbelow, an explanation will be made about each of the steps sequentially.

At first, a sol-gel solution is prepared to form a coating film to which a pattern is transferred by a sol-gel method (solution preparation step). For example, in a case that silica is synthesized by the sol-gel method on the substrate, the sol solution of metal alkoxide (silica precursor) is prepared. The silica precursor is exemplified by metal alkoxides including, for example, tetraalkoxide monomers such as tetramethoxysilane (MTES), tetraethoxysilane (TEOS), tetra-i-propoxysilane, tetra-n-propoxysilane, tetra-i-butoxysilane, tetra-n-butoxysilane, tetra-sec-butoxysilane, and tetra-t-butoxysilane; trialkoxide monomers such as methyl trimethoxysilane, ethyl trimethoxysilane, propyl trimethoxysilane, isopropyl trimethoxysilane, phenyl trimethoxysilane, methyl triethoxysilane, ethyl triethoxysilane, propyl triethoxysilane, isopropyl triethoxysilane, phenyl triethoxysilane, methyl tripropoxysilane, ethyl tripropoxysilane, propyl tripropoxysilane, isopropyl tripropoxysilane, phenyl tripropoxysilane, methyl triisopropoxysilane, ethyl triisopropoxysilane, propyl triisopropoxysilane, isopropyl triisopropoxysilane, phenyl triisopropoxysilane; a polymer obtained by polymerizing the above monomers in small amounts; and a composite material characterized in that functional group and/or polymer is introduced into a part of the material. Further, the silica precursor is exemplified, for example, by metal acetylacetonate, metal carboxylate, oxychloride, chloride, and mixtures thereof. The silica precursor, however, is not limited thereto. Examples of metal species include, in addition to Si, Ti, Sn, Al, Zn, Zr, In, and mixtures thereof, but are not limited thereto. It is also possible to use any appropriate mixture of precursors of the above oxidized metals.

In a case that a mixture of TEOS and MTES is used, the mixture ratio thereof can be 1:1, for example, in a molar ratio. The sol solution produces amorphous silica by performing hydrolysis and polycondensation reaction. An acid such as hydrochloric acid or an alkali such as ammonia is added in order to adjust pH of the solution as a synthesis condition. The pH is preferably not more than 4 or not less than 10. Water may be added to perform the hydrolysis. An amount of water to be added can be 1.5 times or more with respect to metal alkoxide species in the molar ratio.

Examples of the solvent include alcohols such as methanol, ethanol, isopropyl alcohol (IPA), and butanol; aliphatic hydrocarbons such as hexane, heptane, octane, decane, and cyclohexane; aromatic hydrocarbons such as benzene, toluene, xylene, and mesitylene; ethers such as diethyl ether, tetrahydrofuran, and dioxane; ketones such as acetone, methyl ethyl ketone, isophorone, and cyclohexanone; ether alcohols such as butoxyethyl ether, hexyloxyethyl alcohol, methoxy-2-propanol, and benzyloxyethanol; glycols such as ethylene glycol and propylene glycol; glycol ethers such as ethylene glycol dimethyl ether, diethylene glycol dimethyl ether, and propylene glycol monomethyl ether acetate; esters such as ethyl acetate, ethyl lactate, and γ-butyrolactone; phenols such as phenol and chlorophenol; amides such as N,N-dimethylformamide, N,N-dimethylacetamide, and N-methylpyrrolidone; halogen-containing solvents such as chloroform, methylene chloride, tetrachloroethane, monochlorobenzene, and dichlorobenzene; hetero-element containing compounds such as carbon disulfide; water; and mixture solvents thereof. Especially, ethanol and isopropyl alcohol are preferable. Further, a mixture of water and ethanol and a mixture of water and isopropyl alcohol are also preferable.

As an additive, it is possible to use, for example, polyethylene glycol, polyethylene oxide, hydroxypropylcellulose, and polyvinyl alcohol for viscosity adjustment; alkanolamine such as triethanolamine as a solution stabilizer; β-diketone such as acetylacetone; β-ketoester; formamid; dimethylformamide; and dioxane.

The sol solution prepared as described above is applied on the substrate (application step). As the substrate, substrates made of inorganic materials such as glass, silica glass, and silicon substrates or substrates of resins such as polyethylene terephthalate (PET), polyethylene terenaphthalate (PEN), polycarbonate (PC), cycloolefin polymer (COP), polymethyl methacrylate (PMMA), polystyrene (PS), polyimide (PI), and polyarylate may be used. The substrate may be transparent or opaque. In a case that a substrate having a concavity and convexity pattern obtained from the substrate is used for production of the organic EL element as will be described later, the substrate desirably has resistance to heat and ultraviolet (UV) light etc. In view of this, the substrates made of the inorganic materials such as the glass, the silica glass, and the silicon substrates are more preferable. It is allowable to perform a surface treatment or provide an easy-adhesion layer on the substrate in order to improve adhesion property and to provide a gas barrier layer in order to keep out moisture and/or gas such as oxygen. As a method for applying the sol solution, it is possible to use any application method such as a bar coating method, a spin coating method, a spray coating method, a dip coating method, a die coating method, and an ink-jet method. Among the methods as described above, the bar coating method, the die coating method, and the spin coating method are preferable, because the sol solution can be uniformly applied on the substrate having a relatively large area and the application can be quickly completed prior to gelation of the sol solution. It is noted that, since a desired concavity and convexity pattern by a sol-gel material layer is formed in subsequent steps, the surface of the substrate (including the surface treatment or the easy-adhesion layer in case that the surface treatment or the easy-adhesion layer is present) may be flat, and the substrate itself does not have the desired concavity and convexity pattern.

After the application step, the substrate is kept in the atmosphere or under reduced pressure to evaporate the solution in the applied coating film (hereinafter referred to also as "sol-gel material layer" as appropriate) (drying step), Subsequently, the resin film structure 100 (mold) is pressed against the coating film (pressing step). In this situation, the resin film structure 100 may be pressed by using a pressing roll. A period of time during which the mold and the coating film are brought in contact with each other in a roll process is shorter than that in a pressing system, and thus there are advantages such that it is possible to prevent deformation of pattern due to difference among coefficients of thermal expansion of the mold, the substrate, a stage on which the substrate is provided, and the like; it is possible to prevent generation of bubbles of gas in the pattern due to bumping of the solvent in the gel solution or to prevent trace or mark of gas from being left; it is possible to reduce transfer pressure and peeling force due to line contact with the substrate (coating film), and thereby making it possible to deal with a larger substrate readily; no bubble is included during the pressing; and the like. Further, the heating may be performed while pressing the resin film structure 100.

After the resin film structure 100 as the mold is pressed against the coating film (sol-gel material layer), the coating film may be subjected to the pre-sintering (pre-sintering step). The pre-sintering promotes gelation of the coating film to solidify the pattern, and thereby the pattern is less likely to be collapsed during the peeling. In a case that the pre-sintering is performed, the heating is preferably performed at a temperature from 40 degrees Celsius to 150 degrees Celsius in the atmosphere. It is not indispensable to perform the pre-sintering.

The resin film structure 100 is peeled off from the coating film (sol-gel material layer) after the pressing step or the pre-sintering step. In a case that the roll is used during the pressing, the peeling force may be smaller than that in a case that a plate-shaped mold is used, and it is possible to easily peel off the mold from the coating film without remaining the coating film in the mold.

After the resin film structure 100 is peeled off from the coating film (sol-gel material layer) on the substrate, the coating film is subjected to the main sintering (main sintering step). Hydroxyl group and the like contained in silica (amorphous silica) forming the coating film is desorbed or eliminated by the main sintering to further strengthen the coating film. The main sintering may be performed at a temperature from 200 degrees Celsius to 1200 degrees Celsius for about 5 minutes to 6 hours. Accordingly, the coating film is cured, and thereby obtaining a sol-gel structure (diffraction grating) with a concavity and convexity pattern film which corresponds to the concavity and convexity pattern of the resin film structure 100, that is, a sol-gel structure (diffraction grating) in which the sol-gel material layer having an irregular concavity and convexity pattern is directly formed on the flat substrate. In this situation, depending on a sintering temperature and a sintering time, the silica as the sol-gel material layer is amorphous, crystalline, or in a mixture state of the amorphous and the crystalline.

In a case that the replica 110 (or sol-gel structure) is duplicated using the resin film structure 100, or in a case that another replica is duplicated using the obtained replica 110 (or sol-gel structure), a film may be laminated or stacked, on the surface of the resin film structure 100 or the replica 110 having the concavity and convexity pattern, by a gas phase method such as a vapor deposition or a sputtering method. By stacking the film as described above, in a case that transfer etc. is performed with, for example, applying the resin onto the surface of the film, the adhesion between the substrate and the resin (for example, a UV curable resin) can be lowered, so that the master block is more likely to be easily peeled. Examples of the vapor-deposited film include metals such as aluminum, gold, silver, platinum, and nickel; and metal oxides such as aluminum oxide. In addition, the thickness of the vapor-deposited film is preferably 5 to 500 nm. In a case that the thickness is less than the lower limit, a uniform film is difficult to obtain, so that sufficient effect of lowering the adhesion is decreased. In a case that the thickness exceeds the upper limit, the shape of the master block is more likely to be dull. In a case that the cured resin layer of the resin film structure 100 or the replica 110 is made of a UV curable resin, postcure may be conducted as appropriate by, for example, ultraviolet light irradiation, after curing of the resin.

In the steps shown in FIGS. 3B and 3D, the curable resins 80, 82 are applied on the transparent supporting substrates 90, 92, respectively. In addition, it is allowable to use one obtained as follows as the master block. The curable resin is applied directly on the surface of the metal substrate 70 which is the master block or the surface of the cured resin layer 80, and then the cured resin is detached. Alternatively, instead of applying the resin onto the surface of the master block, it is allowable to employ, as the master block, a concavity and convexity film of the cured resin obtained as follows. That is, the master block is pressed onto the coating film of the resin, and the resin is cured.

B. Method for Producing Substrate by BKL Method

As described in detail in PCT International Publication No. WO2011/007878A1, the BKL method includes a step in which a vapor-deposited film is formed, under a temperature condition of 70 degrees Celsius or above, on the surface of a polymer film made of a polymer of which volume changes by heat, and then the polymer film and the vapor-deposited film are cooled, thereby forming concavities and convexities of wrinkles in the surface of the vapor-deposited film (a concavity and convexity shape formation step), and a step in which a master block material is attached on the vapor-deposited film and then the master block is cured, and thereafter the cured master block material is detached from the vapor-deposited film to obtain a master block (a master block formation step).

Figure 5A:
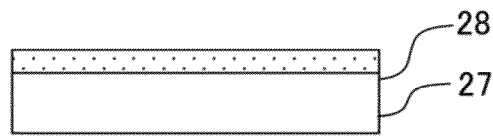
FIGS. 5A-5D schematically show a method for producing the substrate in accordance with BKL method.
Figure 5B:
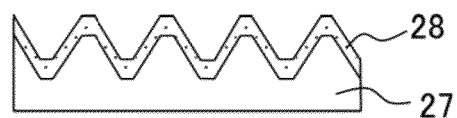
Figure 5C:
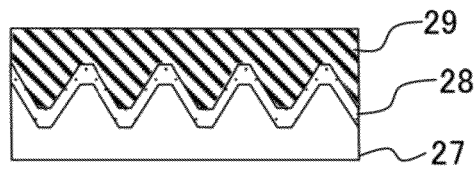
Figure 5D:
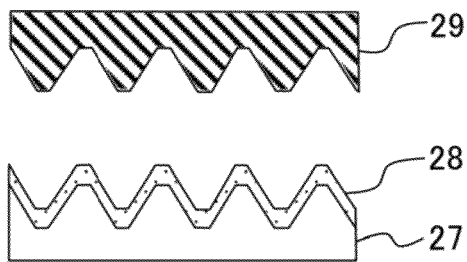

FIGS. 5A and 5D are schematic views for explaining a preferred embodiment of a method for producing the master block in a method for producing the diffraction grating in accordance with the BKL method. FIG. 5A is a schematic cross-sectional view showing a state in which the vapor-deposited film is formed on the surface of the polymer film in the method for producing the master block; FIG. 5B is a schematic cross-sectional view showing a state in which the concavities and convexities of wrinkles are formed in the surface of the vapor-deposited film by cooling the polymer film and the vapor-deposited film; FIG. 5C is a schematic cross-sectional view showing a state in which the master block material is attached on the vapor-deposited film with the concavities and convexities and then cured; and FIG. 5D is a schematic cross-sectional view showing a state in which the cured master block is detached from the vapor-deposited film.

In the concavity and convexity shape formation step, first, the polymer film made of the polymer of which volume changes by heat is prepared. As the polymer of which volume changes by heat, one of which volume changes by heating or cooling (for example, one having a coefficient of thermal expansion of 50 ppm/K or more) can be used as appropriate. As the polymer, a silicone-based polymer is more preferable, and a silicone-based polymer containing polydimethylsiloxane is particularly preferable, from the viewpoint that the concavities and convexities of wrinkles are easily formed on the surface of the vapor-deposited film, because the difference between the coefficient of thermal expansion of the polymer and the coefficient of thermal expansion of the vapor-deposited film is large, and because the polymer has a high flexibility. As a method for forming the polymer film as described above, for example, a spin coating method, a dip coating method, a dropping method, a gravure printing method, a screen printing method, a relief printing method, a die coating method, a curtain coating method, an ink-jet method, a spray coating method, a sputtering method, a vacuum vapor deposition method, or the like can be employed. Further, the thickness of the polymer film is preferably within a range from 10 to 5000 μm, and is more preferably within a range from 10 to 2000 μm.

In the concavity and convexity shape formation step, next, a vapor-deposited film 28 is formed on a surface of a polymer film 27 under a temperature condition of 70 degrees Celsius or above (see FIG. 5A). The temperature at which the vapor-deposited film 28 is formed needs to be 70 degrees Celsius or above, and is more preferably 90 degrees Celsius or above. In a case that the temperature is lower than 70 degrees Celsius, the concavities and convexities of wrinkles can not be formed sufficiently on the surface of the vapor-deposited film. As the method for forming the vapor-deposited film 28, any known method such as a vapor deposition method or a sputtering method can be employed as appropriate. Of these methods, the vapor deposition method is preferably employed, from the viewpoint of maintaining the shape of the concavities and convexities formed on the surface of the polymer film. Meanwhile, a material of the vapor-deposited film 28 is not particularly limited, and examples thereof include metals such as aluminum, gold, silver, platinum, and nickel; and metal oxides such as aluminum oxide.

In the concavity and convexity shape formation step, subsequently, concavities and convexities of wrinkles are formed on the surface of the vapor-deposited film 28 by cooling the polymer film 27 and the vapor-deposited film 28 (see FIG. 5B). Since there is the difference between the coefficient of thermal expansion of the polymer film 27 and the coefficient of thermal expansion of the vapor-deposited film 28, the concavities and convexities (the so-called bucking pattern, or the so-called turing pattern) of wrinkles can be formed on the surface of the vapor-deposited film 28 as shown in FIG. 5B, when the volume of each of the polymer film 27 and the vapor-deposited film 28 as shown in FIG. 5A changes by heat. Further, the temperatures of the polymer film 27 and the vapor-deposited film 28 after the cooling are preferably 40 degrees Celsius or below. In a case that the temperatures of the polymer film 27 and the vapor-deposited film 28 after the cooling exceed the upper limit, it tends to be difficult to form the concavities and convexities of wrinkles on the surface of the vapor-deposited film. Furthermore, the rate of temperature drop in cooling the polymer film 27 and the vapor-deposited film 28 is preferably within a range from 1 to 80 degrees Celsius/minute. In a case that the rate of temperature drop is less than the lower limit, the concavities and convexities tend to be relaxed. On the other hand, in a case that the rate of temperature drop exceeds the upper limit, scars such as cracks tend to be easily formed on the surfaces of the polymer film and the vapor-deposited film.

In the master block formation step, first, a master block material 29 is attached onto the vapor-deposited film 28 and cured as shown in FIG. 5C. The master block material 29 is not particularly limited, and examples thereof include inorganic substances such as nickel, silicon, silicon carbide, tantalum, glassy carbon, silica glass, and silica; and resin compositions such as silicone-based polymers (silicone rubbers), urethane rubbers, norbornene resins, polycarbonate, polyethylene terephthalate, polystyrene, polymethyl methacrylate, acrylic, and liquid crystal polymers. Of these master block materials 29, silicone-based polymers, nickel, silicon, silicon carbide, tantalum, glassy carbon, silica glass, and silica are more preferable, silicone-based polymers are further more preferable, and silicone-based polymers containing polydimethyl siloxane are particularly preferable, from the viewpoint of moldability, followability to a fine pattern, and mold releasability. Further, a method for attaching the master block material 29 as described above is not particularly limited, and, examples of employable method include a vacuum vapor deposition method; and various coating methods such as a spin coating method, a spray coating method, a dip coating method, a dropping method, a gravure printing method, a screen printing method, a relief printing method, a die coating method, a curtain coating method, an ink-jet method, and a sputtering method. Although conditions for curing the master block material 29 vary depending on what kind of the master block material is used, it is preferable to set a curing temperature within a range from room temperature to 250 degrees Celsius, and a curing time within a range from 0.5 minutes to 3 hours, for example. Further, a method may be employed in which the master block material 29 is cured by irradiation with energy rays such as ultraviolet rays and electron beams. In such a case, the amount of the irradiation is preferably within a range from 20 mJ/cm$^2$ to 10 J/cm$^2$.

In the master block formation step, subsequently, the master block 29 is obtained by detaching the cured master block material 29 from the vapor-deposited film 28 as shown in FIG. 5D. A method for detaching the master block 29 from the vapor-deposited film 28 as described above is not particularly limited, and any known method can be employed as appropriate.

In the BKL method, the concavity and convexity shape formation step and the master block formation step may be repeated by use of the master block 29 obtained as the polymer film. Accordingly, it is possible to deepen the wrinkles formed on the surface of the master block and to increase the average height of the concavities and convexities formed on the surface of the master block.

Further, it is also possible to employ, as the master block, one obtained in such a manner that a resin (a material used as the master block material) is applied on the surface of the obtained master block 29, then cured, and thereafter detached. Furthermore, it is also possible to employ, as the master block, a concavity and convexity film of a cured resin obtained by pressing the master block 29 onto a coating film of a resin and curing the resin, instead of applying the resin onto the surface of the obtained master block 29. A resin film in which the concavities and convexities are inverted as described above can also be used as the master block.

A final master block may be manufactured from the master block 29 by repeating inversion and/or transfer of the concavities and convexities through one or more intermediate master blocks. As the intermediate master blocks, those obtained by appropriately inverting and/or transferring the concavity and convexity structure as described above can be used. Further, in a case that the master block is manufactured by repeating the inversion and/or the transfer of the concavities and convexities as described above, it is possible to conduct temporal transfer to a flexible material (for example, a plastic film or a silicone rubber) during the transfer of the concavity and convexity structure of the master block, in order to facilitate the transfer of the concavity and convexity structure even in a case in which a non-flexible substrate (for example, glass) for which the resin film or the like is difficult to peel is used. Hence, the same concavity and convexity structure (the same even-odd property of the concavity and convexity structure) as that of the master block used tends to be easily obtained. In addition, it is also possible to further repeat the concavity and convexity shape formation step and the master block formation step by use of, as the master block 29, polymer films obtained by applying the polymer of which volume changes by heat onto the intermediate master blocks and curing the polymer. In addition, in a case that the intermediate master block is made of an UV curable resin, the intermediate master block may be obtained by irradiation with ultraviolet light during the manufacturing thereof, and then postcure may be conducted by irradiation again with ultraviolet light. The postcure conducted by irradiating again the master block made of the UV curable resin with ultraviolet light as described above leads to a tendency that the degree of the cross-linking in the master block is raised or improved and the mechanical strength and the chemical resistance are improved.

Further, the master blocks (including the intermediate master blocks) may be converted to metal master blocks by performing a plating treatment by use of any known method. The formation of metal master block by plating as described above leads to a tendency that master blocks which are excellent in mechanical strength and which can be used repeatedly can be obtained. The use of the master block obtained by performing the plating treatment as the mold of nanoimprint and the like enables repeated transfers to cured resin substrates, and thereby enabling mass production of a resin substrate having a predetermined concavity and convexity pattern. Examples of materials usable for the plating include nickel, copper, iron, nickel-cobalt alloys, nickel-iron alloys, and the like. Note that the thickness of the plating layer is preferably 50 μm to 1 mm, from the viewpoints of mechanical strength, time required for the formation of the metal master block, and the like.

Then, in the present invention, a master block obtained by conducting the BKL method as described above (a master block 29, or the master block obtained by repeating the concavity and convexity shape formation step and the master block formation step by use of the master block 29 obtained as a polymer film, or the like) can be used as the master block for forming the diffraction grating. Further, a sol-gel structure having concavities and convexities made of the sol-gel material may be manufactured by use of the resin substrate obtained by conducting the BKL method as the master block in the similar manner as the manufacture of the sol-gel structure having concavities and convexities made of the sol-gel material by use of the resin film structure obtained by conducting the BCP method as the master block.

Further, a master block, which is obtained by heating the master block obtained by the BKL method under the atmospheric pressure under a temperature condition of about 80 to 200 degrees Celsius for about 1 to 48 hours, may be used as the master block used for manufacturing the diffraction grating. By heating the master block as described above, it is possible to obtain, as the diffraction grating, a diffraction grating having an excellent concavity and convexity structure for the organic EL element.

2. Step of Inspecting Substrate

Figure 6:
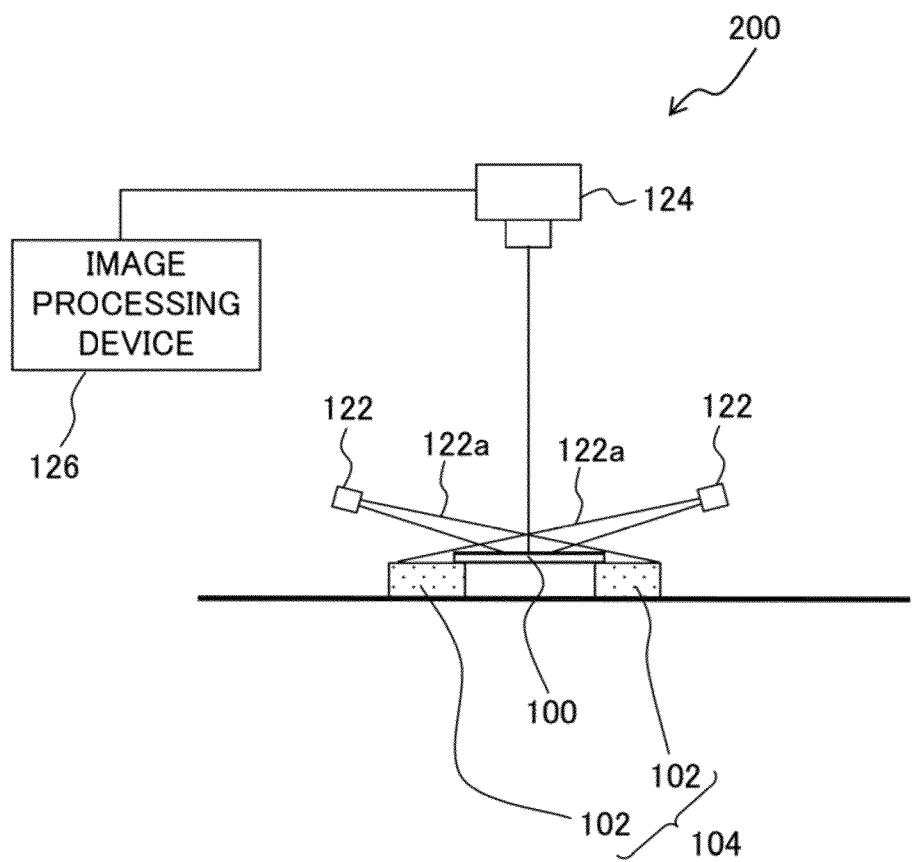
FIG. 6 schematically shows an inspection step of the substrate according to the method of the present invention.

The substrate obtained by the BCP method or BKL method (including the substrate having the concavity and convexity structure made of the sol-gel material) has the irregular concave and convex surface, and an explanation will be made about optical characteristics of such a substrate, in particular, a step of inspecting unevenness of luminance (step S2 in FIG. 1). It is considered that the unevenness of luminance is generated by local distribution of a specific pitch of the concavities and convexities of the substrate, local distribution of orientation of the concavities and convexities in a specific direction, unevenness of depth of the concavities and convexities, and the like. The scattered light from the concave and convex surface of a substrate 100 having the irregular concave and convex surface is observed by using an apparatus 200 as shown in FIG. 6. The apparatus 200 includes a stage 104 which is formed of a pair of black blocks 102 arranged on a floor surface at a predetermined distance; a pair of light sources 122 which is arranged obliquely above the stage 104 at positions symmetrical with the center of the stage 104; an imaging element 124 which is arranged above the center of the stage 104 at a predetermined distance from the stage 104; and an image processing device 126 connected to the imaging element 124. The pair of light sources 122 may be any light source which is capable of emitting light 122a having high directivity and with which a predetermined width (area) is illuminated. For example, it is possible to use a LED bar light in which a plurality of LEDs are embedded in an array form in one direction. The imaging element 124 may be any imaging element provided that the element has pixels which are capable of two-dimensionally receiving the scattered light from the entire substrate 100, and a digital camera, a two-dimensional luminance colorimeter, and the like are suitably used. The imaging element 124 preferably has the number of pixels of at least 30 or more. The image processing device 126 is a computer which processes image data detected by the imaging element 124. The scattered light from the concave and convex surface 100a of the substrate 100 is observed in the following manner using the apparatus 200. The luminance distribution is obtained from the observed scattered light.

The substrate 100 is arranged on the stage 104 so that the concave and convex surface 100a faces upward. The concave and convex surface 100a of the substrate 100 is irradiated obliquely from above with the light from the pair of light sources 122, for example, at an incident angle of about 80° to a normal direction of the concave and convex surface 100a of the substrate 100. The light is scattered in various directions from the concave and convex surface 100a of the substrate 100 which is irradiated with the light. The scattered light includes diffracted light from the concave and convex surface. The imaging element 124 is arranged relative to the substrate 100 such that end portions of the concave and convex surface 100a of the substrate 100 are included in field of view of the imaging element 124, so that the light, of the scattered light, which is directed from the entire area of the concave and convex surface 100a of the substrate 100 to an approximately normal direction of the concave and convex surface 100a of the substrate 100, is allowed to be received by the imaging element 124. The image data detected by each pixel is subjected to image processing by the image processing device 126, and light intensity corresponding to the two-dimensional position of the concave and convex surface 100a of the substrate 100 is obtained. Although the drawing in which the substrate 100 is disposed parallel to the floor surface is exemplified in this description, the substrate may be in a state of standing upright by a support and the like or in a state of inclining at a certain angle.

Figure 7:
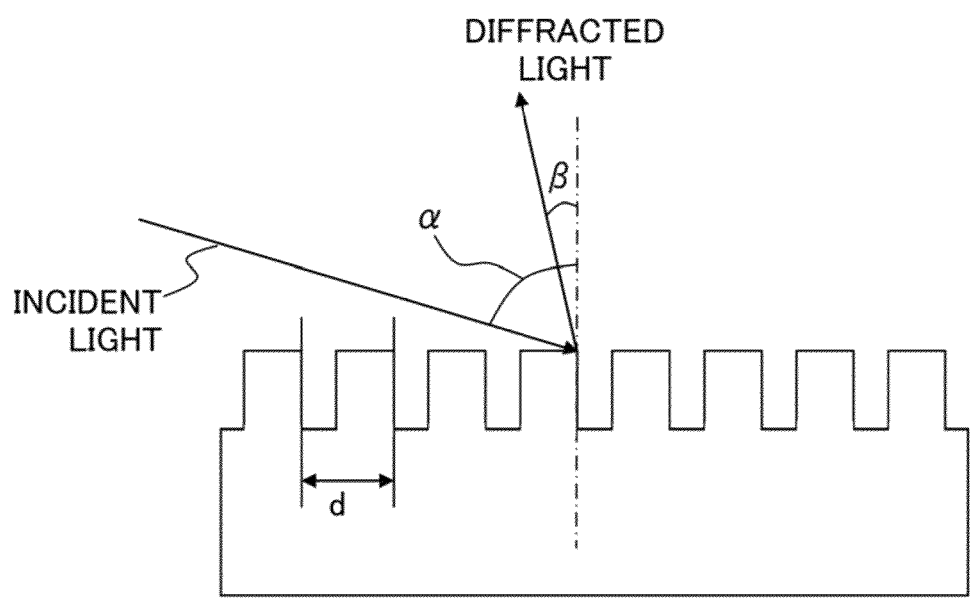
FIG. 7 schematically shows a diffraction condition of a substrate having a concave and convex surface.

Here, in a case that the concavities and convexities of the concave and convex surface 100a of the substrate 100 have a rectangular concavity and convexity pattern as shown in FIG. 7, diffraction occurs in accordance with Bragg diffraction condition. The following relational expression holds, on the assumption that an angle between the incident light and the normal of the diffraction-grating surface (incident angle) is defined as α and that an angle between the diffracted light and the normal of the diffraction grating (diffraction angle) is defined as β.

$d(\sin \alpha \pm \sin \beta) = m\lambda$ or $\sin \alpha \pm \sin \beta = Nm\lambda$ Here, d represents a period (pitch) of the diffraction grating, N represents the number of grooves per 1 mm, m represents diffraction order (m=0, ±1, ±2 . . . ), and λ represents wavelength.

In accordance with the relational expression described above, the diffracted light of m=0 (zero-order light) is regularly reflected irrespective of the wavelength λ. Thus, the zero-order light of the incident light obliquely coming into the surface is not directed to the direction of the imaging element 124 and does not come into the imaging element 124. Further, in a case of m≠0, the diffraction angle β which satisfies the relational expression varies by wavelength λ, and changes depending on the period d of the diffraction grating and the incident angle α. Thus, the diffracted light can not be observed in some cases depending on the wavelength λ, the incident angle α, and the number of grooves N (or the period d). For example, in a case that +1-order diffracted light (m=+1) from the diffraction grating (incident angle α=80°, the number of grooves N=3000/mm (d=333 nm)) is assumed, sin β is 1.12 when the wavelength λ is 700 nm, thus, it is appreciated that the diffracted light can not be obtained. Therefore, it is found out that, in order to obtain the first-order diffracted light directed to the front direction in a case that the light enters obliquely at a relatively a shallow angle (that is, a great incident angle) in the construction of the apparatus 200 shown in FIG. 6, the ratio of the incident angle α to the period d of the diffraction angle is restricted based on the relational expression. Especially, it is preferable to use light having the wavelength which is substantially the same as the period of the diffraction grating, in particular, light having the wavelength λ which is 0.5 to 2.0 times as long as the period d of the diffraction grating (0.5d≤λ≤2.0d), more preferably light having the wavelength λ which is 0.5 to 1.5 times as long as the period d of the diffraction grating (0.5d≤λ≤1.5d), in order that the first-order diffracted light having a high diffraction efficiency is introduced into the imaging element provided in the normal direction of the substrate without causing diffraction of higher-order (±2, ±3 . . . ) than the first-order. In a case that the inspection light has a wavelength band other than single wavelength, λ represents the central wavelength.

Regarding the incident angle, for example, it is considered a case in which the substrate having the irregular concave and convex surface, which is an object of the present invention, is applied to the organic EL element. It has been found out by experiments conducted by the inventors of the present invention that, in a case that the substrate having the irregular concavity and convexity structure is used for the organic EL, the pitch of concavities and convexities on the irregular concave and convex surface is desirably 100 nm to 600 nm, more desirably 150 nm to 600 nm (for example, see PCT International Publication No. WO2011/007878A1). It has been found out by experiments conducted by the inventors of the present invention that the incident angle α is preferably 30°<α<90°, and more preferably 60°<α<85° in a case that, for example, the light having the wavelength of 470 nm is used as each of a pair of light-sources with respect to the substrate having the irregular concave and convex surface, the pitch of which is within a range of 150 nm to 600 nm. In a case that the incident angle α is less than 30°, the diffraction efficiency is low and the luminance is lowered. Thus, the unevenness of luminance is not observed clearly. Further, the following problems arise. That is, since an area which can be irradiated with the light uniformly is small, the area subjected to the evaluation is small; there is fear that a regular reflection light enters into the imaging element, etc. The lower limit of the incident angle α is further preferably 60° in terms of the diffraction efficiency and the unevenness of luminance. On the other hand, in a case that the incident angle α exceeds 90°, the back surface of the substrate is irradiated with the light and the amount of reflected light is decreased. In a case that an opaque object such as a metal plate is used as the substrate, the observation itself can not be performed. In a case that the incident angle α exceeds 85°, the surface of the sample can not be irradiated with the light efficiently even in a case of using a highly directional light source. Thus, the amount of light entering the imaging element is insufficient.

3. Judgment Step

Subsequently, whether or not the substrate has a uniform luminance distribution is evaluated and judged based on the result obtained by the above inspection step (step S3 of FIG. 1). In the following, an explanation will be made about an evaluation/judgment method in a case of using a digital camera as the imaging element. A pixel value is read from output of each pixel of the imaging element obtained in the above inspection step. The pixel value corresponds to the intensity or luminance of the scattered (diffracted) light of each pixel. The maximum value, the minimum value, and the average value of the pixel values of the entire concave and convex surface of the substrate are obtained. Then, it is judged whether the maximum value, the minimum value, and the average value are within desired acceptable ranges, respectively. Further, it is judged whether the intensity distribution of the scattered (diffracted) light is within a desired range. For example, the ratio of the maximum value to the minimum value is obtained, and the unevenness of luminance can be judged depending on the magnitude of maximum value/minimum value. It has been found out by the inventors of the present invention that, in a case that the maximum value/minimum value of the pixel values is 1.5 or more in the substrate of the present invention and the organic EL element of the present invention in which an electrode and an organic layer are stacked on the substrate to maintain concavities and convexities, the uniformity of light emission of the organic EL element is obviously deteriorated, that is, the unevenness of luminance exceeds the acceptable range. Illumination, a display, and the like using such an organic EL element are not suitable as products. However, it is possible to set the maximum value/minimum value of the pixel values as a threshold value depending on the acceptability limit of the unevenness of luminance, that is, depending on desired uniformity of the luminance and the way of use of the organic EL element. Alternatively, difference of scattered intensity (fluctuation in scattered intensity) may be expressed as the following expression to perform judgment by comparing with a predetermined value.

Difference of scattered intensity=(maximum value−minimum value)/(maximum value+minimum value)×100

Regarding the average pixel value, evaluation can be performed by the following method. That is, it is performed a process in which the measured pixel values are converted into a gray scale. By converting the pixel value of each pixel on the line in a predetermined direction (X or Y direction) on the taken image into the gray scale, (cross-section) profile of intensity of the scattered light on the line can be obtained. Denoting the maximum pixel value which can be recorded in the imaging element (255 in a case of using a general digital camera) by "MAX", in order to make the evaluation of the unevenness of luminance easier, the average value of the pixel values (pixel average value) (after converting into the gray scale) on the line is preferably 0.2 MAX to 0.8 MAX.

In a case that it is judged that the ratio of the maximum value to the minimum value, the difference of scattered intensity, or the average pixel value is within a desired range in the evaluation/judgment step, an organic EL element is produced by using this substrate in accordance with a process which will be described later. In a case that it is judged that the ratio of the maximum value to the minimum value, the difference of scattered intensity or the average pixel value is beyond the desired range, an aftertreatment is performed (step S5 in FIG. 1). As the aftertreatment, whether the defect (unevenness of luminance) of the substrate is caused by dust, scratch, periodic error, or random error is analyzed. In a case that the defect is caused by adhering matter such as the dust, it is possible to perform repair by applying pressurized air on the surface of the substrate to blow off the adhering matter. Thereafter, the substrate is again subjected to the above inspection. In a case that the inspection is performed for a plurality of substrates in a continuous-type manner or batch-type manner, it is possible to provide a step of separating a substrate in which the ratio of the maximum value to the minimum value, the difference of scattered intensity, or the average pixel value is within the desired range from a substrate in which the ratio of the maximum value to the minimum value, the difference of scattered intensity, or the average pixel value is beyond the desired range based on the inspection result. The substrate in which the ratio of the maximum value to the minimum value, the difference of scattered intensity, or the average pixel value is within the desired range can be supplied to a production line of the organic EL element and the like to produce the organic EL element and the like sequentially. The substrate in which the ratio of the maximum value to the minimum value, the difference of scattered intensity, or the average pixel value is beyond the desired range can be subjected to a defect analysis or can be discarded.

<Method for Producing Organic EL Element>

Figure 8:
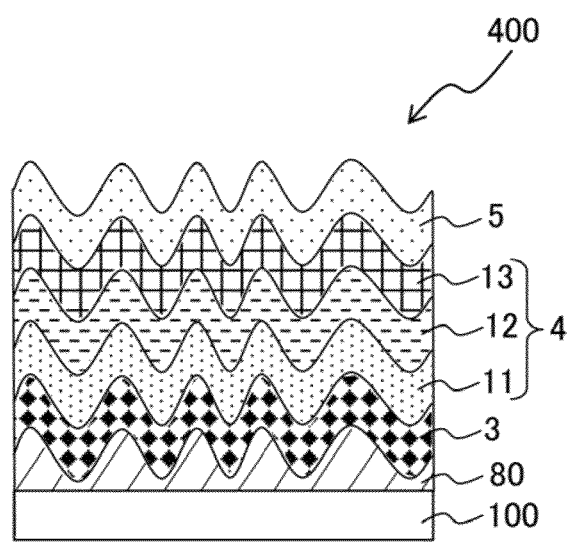
FIG. 8 shows a cross-section structure of an organic EL element.

Subsequently, an organic EL element is produced by using a substrate which passed the above judgment step among the resin film substrates (or glass substrates or substrates in which concavities and convexities made of the sol-gel material are formed) obtained by using methods exemplified by the BCP method and BKL method. An explanation will be made about a method for producing the organic EL element using a diffraction grating made of the resin film substrate with reference to FIG. 8. At first, as shown in FIG. 8, a transparent electrode denoted by a reference numeral 3 is stacked on a resin layer 80 (see FIG. 3C) of the resin film (substrate) 100 to maintain a concavity and convexity structure formed on the surface of the resin 80. As a material for the transparent electrode 3, for example, indium oxide, zinc oxide, tin oxide, indium-tin oxide (ITO), which is a composite material thereof, gold, platinum, silver, or copper is used. Of these materials, ITO is preferable from the viewpoint of the transparency and the electrical conductivity. The thickness of the transparent electrode 3 is preferably within a range from 20 to 500 nm. In a case that the thickness is less than the lower limit, the electrical conductivity is more likely to be insufficient. In a case that the thickness exceeds the upper limit, there is possibility that the transparency is so insufficient that the emitted EL light cannot be extracted to the outside sufficiently. As a method for stacking the transparent electrode 3, any known method such as a vapor deposition method or a sputtering method can be employed as appropriate. Of these methods, the sputtering method is preferably employed from the viewpoint of improving adhesion property. It is allowable to put a glass substrate on a side opposite to the resin layer 80 of the resin film 100 before the transparent electrode 3 is provided on the resin layer 80.

Next, an organic layer denoted by a reference numeral 4 as shown in FIG. 8 is stacked on the transparent electrode 3 to maintain the shape of the concavities and convexities formed on the surface of the resin 80. The organic layer 4 is not particularly limited, provided that the organic layer 4 is one usable as an organic layer of the organic EL element. As the organic layer 4, any known organic layer can be used as appropriate. The organic layer 4 may be a stacked body of various organic thin films, and, for example, may be a stacked body of an anode buffer layer 11, a hole transporting layer 12, and an electron transporting layer 13 as shown in FIG. 8. Here, examples of materials for the anode buffer layer 11 include copper phthalocyanine, PEDOT, and the like. Examples of materials for the hole transporting layer 12 include derivatives of triphenylamine, triphenyldiamine derivatives (TPD), benzidine, pyrazoline, styrylamine, hydrazone, triphenylmethane, carbazole, and the like. Examples of materials for the electron transporting layer 13 include aluminum-quinolinol complex (Alq), phenanthroline derivatives, oxadiazole derivatives, triazole derivatives, phenylquinoxaline derivatives, silole derivatives, and the like. The organic layer 4 may be, for example, a stacked body of a hole injecting layer made of a triphenylamine derivative or the like, and a light emitting layer made of a fluorescent organic solid such as anthracene, a stacked body of the light emitting layer and an electron injecting layer made of a perylene derivative or the like, or a stacked body of these hole injecting layer, light emitting layer, and electron injecting layer.

The organic layer 4 may be a stacked body of the hole transporting layer, the light emitting layer, and the electron transporting layer. In this case, examples of materials of the hole transporting layer include aromatic diamine compounds such as phthalocyanine derivatives, naphthalocyanine derivatives, porphyrin derivatives, N,N'-bis(3-methylphenyl)-(1,1'-biphenyl)-4,4'-diamine (TPD), and 4,4'-bis[N-(naphthyl)-N-phenyl-amino]biphenyl(α-NPD); oxazole; oxadiazole; triazole; imidazole; imidazolone; stilbene derivatives; pyrazoline derivatives; tetrahydroimidazole; polyarylalkane; butadiene; and 4,4',4"-tris(N-(3-methylphenyl)N-phenylamino)triphenylamine (m-MTDATA). The materials of the hole transporting layer, however, are not limited thereto.

By providing the light emitting layer, a hole injected from the transparent electrode and electron injected from a metal electrode are recombined to occur light emission. Examples of materials of the light emitting layer include metallo-organic complex such as anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, and aluminum-quinolinol complex (Alq3); tri-(p-terphenyl-4-yl)amine; 1-aryl-2,5-di(2-thienyl) pyrrole derivatives; pyran; quinacridone; rubren; distyrylbenzene derivatives; distyryl arylene derivatives; distyryl amine derivatives; and various fluorescent pigments or dyes. Further, it is preferable that light-emitting materials selected from the above compounds are mixed as appropriate and then are used. Furthermore, it is possible to preferably use a material system generating emission of light from a spin multiplet, such as a phosphorescence emitting material generating emission of phosphorescence and a compound including, in a part of the molecules, a constituent portion formed by the above materials. The phosphorescence emitting material preferably includes heavy metal such as iridium.

A host material having high carrier mobility may be doped with each of the light-emitting materials as a guest material to generate the light emission using dipole-dipole interaction (Forster mechanism), electron exchange interaction (Dexer mechanism). Examples of materials of the electron transporting layer include heterocyclic tetracarboxylic anhydrides such as nitro-substituted fluorene derivatives, diphenylquinone derivatives, thiopyran dioxide derivatives, and naphthaleneperylene; and metallo-organic complex such as carbodiimide, fluorenylidene methane derivatives, anthraquino dimethane and anthrone derivarives, oxadiazole derivatives, and aluminum-quinolinol complex (Alq3). Further, in the oxadiazole derivatives mentioned above, it is also possible to use, as an electron transporting material, thiadiazole derivatives in which oxygen atoms of oxadiazole rings are substituted by sulfur atoms and quinoxaline derivatives having quinoxaline rings known as electron attractive group. Furthermore, it is also possible to use a polymeric material in which the above materials are introduced into a macromolecular chain or the above materials are made to be a main chain of the macromolecular chain. It is noted that the hole transporting layer or the electron transporting layer may also function as the light-emitting layer. In this case, there are two organic layers between the transparent electrode and the metal electrode which will be described later.

From the viewpoint of facilitating charge injection or hole injection into such a organic layer 4, a layer made of a metal fluoride such as lithium fluoride (LiF) or $Li_2O_3$, a highly active alkaline earth metal such as Ca, Ba, or Cs, an organic insulating material, or the like may be provided on the transparent electrode 3 or the organic layer 4.

In a case that the organic layer 4 is a stacked body formed of the anode buffer layer 11, the hole transporting layer 12, and the electron transporting layer 13, the thicknesses of the anode buffer layer 11, the hole transporting layer 12, and the electron transporting layer 13 are preferably within a range from 1 to 50 nm, a range from 5 to 200 nm, and a range from 5 to 200 nm, respectively, from the viewpoint of maintaining the shape of the concavities and convexities formed on the surface of the cured resin layer. In a case that the organic layer 4 is a stacked body formed of the hole transporting layer, the light-emitting layer, and the electron transporting layer, the thicknesses of the hole transporting layer, the light-emitting layer, and the electron transporting layer are preferably within a range from 1 to 200 nm, a range from 5 to 100 nm, and a range from 5 to 200 nm, respectively. As a method for stacking the organic layer 4, any known method such as a vapor deposition method, a sputtering method, and a die coating method can be employed as appropriate. Of these methods, the vapor deposition method is preferably employed from the viewpoint of maintaining the shape of the concavities and convexities formed on the surface of the resin 80.

Subsequently, as shown in FIG. 8, a metal electrode denoted by a reference numeral 5 is stacked on the organic layer 4 so as to maintain the shape of the concavities and convexities formed on the surface of the resin 80 in the step for forming the organic EL element. Materials of the metal electrode 5 are not particularly limited, and a substance having a small work function can be used as appropriate. Examples of the materials include aluminum, MgAg, MgIn, and AlLi. The thickness of the metal electrode 5 is preferably within a range from 50 to 500 nm. In a case that the thickness is less than the lower limit, the electrical conductivity is more likely to be decreased. In a case that the thickness exceeds the upper limit, there is possibility that the shape of the concavities and convexities is difficult to maintain. Any known method such as a vapor deposition method and a sputtering method can be adopted to stack the metal electrode 5. Of these methods, the vapor deposition method is preferably employed from the viewpoint of maintaining the concavity and convexity structure formed on the surface of the resin 80. Accordingly, an organic EL element 400 having a structure as shown in FIG. 8 can be obtained.

The resin 80 on the base member 100 manufactured by the BCP method, has the chevron-shaped structure. Thus, each of the transparent electrode 3, the organic layer 4, and the metal electrode 5 is readily stacked to maintain the chevron-shaped structure of the resin 80. Hence, it is possible to sufficiently suppress repetition of multiple reflection of light generated in the organic layer 4 in the element due to total reflection at each interface. Further, it is also possible to re-emit light which has been totally reflected at an interface between the transparent supporting substrate and the air by diffraction effect. Furthermore, since each of the transparent electrode 3, the organic layer 4, and the metal electrode 5 is more likely to have the same structure as the chevron-shaped structure formed on the surface of the resin layer 80, an inter-electrode distance between the transparent electrode 3 and the metal electrode 5 is partially short. For this reason, in comparison with those in which the inter-electrode distance between the transparent electrode 3 and the metal electrode 5 is uniform, an increase in electric field intensity can be expected in application of voltage, and also light emission efficiency of the organic EL element can be improved.

In the diffraction grating (substrate) produced according to the method for producing the substrate of the present invention and the organic EL element including the diffraction grating, the average height of the concavities and convexities formed on the surface (the cured surface of curable resin) of the diffraction grating is preferably within the range from 5 to 200 nm, more preferably within the range from 20 to 200 nm, and further preferably within the range from 50 to 150 nm as described above.

In the diffraction grating (substrate) produced according to the present invention and the organic EL element including the diffraction grating, the average pitch of the concavities and convexities formed on the surface (the cured surface of curable resin) of the diffraction grating is preferably within the range from 100 to 600 nm, and more preferably within the range from 200 to 600 nm as described above.

In the following, the present invention will be described in detail by Examples. However, the present invention is not limited to the examples below.

EXAMPLES

Example 1

In this Example, a substrate having a concave and convex surface was produced by using the BCP method, and then an organic EL element was produced using the produced substrate. At first, it was prepared a block copolymer produced by Polymer Source Inc. which was made of polystyrene (hereinafter referred to as "PS" in an abbreviated manner as appropriate) and polymethyl methacrylate (hereinafter referred to as "PMMA" in an abbreviated manner as appropriate) as described below.

Mn of PS segment=868,000
Mn of PMMA segment=857,000
Mn of block copolymer=1,725,000
Volume ratio between PS segment and PMMA segment (PS: PMMA)=53:47
Molecular weight distribution (Mw/Mn)=1.30
Tg of PS segment=96 degrees Celsius
Tg of PMMA segment=110 degrees Celsius The volume ratio of the first polymer segment and second polymer segment (the first polymer segment: the second polymer segment) in each block copolymer was calculated on the assumption that the density of polystyrene was 1.05 g/cm$^3$, the density of polymethyl methacrylate was 1.19 g/cm$^3$. The number average molecular weights (Mn) and the weight average molecular weights (Mw) of polymer segments or polymers were measured by using gel permeation chromatography (Model No: "GPC-8020" manufactured by Tosoh Corporation, in which TSK-GEL SuperH1000, SuperH2000, SuperH3000, and SuperH4000 were connected in series). The glass transition temperatures (Tg) of polymer segments were measured by use of a differential scanning calorimeter (manufactured by Perkin-Elmer under the product name of "DSC7"), while the temperature was raised at a rate of temperature rise of 20 degrees Celsius/min over a temperature range from 0 to 200 degrees Celsius. The solubility parameters of polystyrene and polymethyl methacrylate were 9.0 and 9.3, respectively (see Kagaku Binran Ouyou Hen (Handbook of Chemistry, Applied Chemistry), 2nd edition).

Toluene was added to 150 mg of the block copolymer and 38 mg of Polyethylene Glycol 4000 manufactured by Tokyo Chemical Industry Co., Ltd. (Mw=3000, Mw/Mn=1.10) as polyethylene oxide so that the total amount thereof was 10 g, followed by dissolving them. Then, the solution was filtrated or filtered through a membrane filter having a pore diameter of 0.5 μm to obtain a block copolymer solution. The obtained block copolymer solution was applied, on a polyphenylene sulfide film (TORELINA manufactured by TORAY INDUSTRIRES, INC.) as a base member, in a film thickness of 200 to 250 nm, by a spin coating. The spin coating was performed at a spin speed of 500 rpm for 10 seconds, and then performed at a spin speed of 800 rpm for 30 seconds. The thin film applied by the spin coating was left at a room temperature for 10 minutes until the thin film was dried.

Subsequently, the base member on which the thin film was formed was heated for 5 hours in an oven of 170 degrees Celsius (first annealing process). Concavities and convexities were observed on the surface of the heated thin film, and it was found out that micro phase separation of the block copolymer forming the thin film was caused (see FIG. 2B).

The heated thin film as described above was subjected to an etching process as described below to selectively decompose and remove PMMA on the base member. The thin film was irradiated with ultraviolet rays at an irradiation intensity of 30 J/cm$^2$ by use of a high pressure mercury lamp. Then, the thin film was immersed in acetic acid, and was subjected to cleaning with ion-exchanged water, followed by being dried. As a result, there was formed, on the base member, a concavity and convexity pattern clearly deeper than the concavities and convexities which appeared on the surface of the thin film by the heating process (see FIG. 2C).

Next, the base member was subjected to a heating process (second annealing process) for 1 hour in an oven of 140 degrees Celsius so that the concavity and convexity pattern formed by the etching process was deformed to have a chevron-shaped structure (process for forming a shape of chevrons) (see FIG. 2D).

About 10 nm of a thin nickel layer was formed as a current seed layer by a sputtering on the surface of the thin film, for which the process for forming the shape of chevrons had been performed (see FIG. 2E). Subsequently, the base member with the thin film was subjected to an electroforming process (maximum current density: 0.05 A/cm$^2$) in a nickel sulfamate bath at a temperature of 50 degrees Celsius to precipitate nickel until the thickness of nickel became 250 μm (see FIG. 2F). The base member with the thin film was mechanically peeled off from the nickel electroforming body obtained as described above (see FIG. 2G). Subsequently, the nickel electroforming body was immersed in Chemisol 2303 manufactured by The Japan Cee-Bee Chemical Co., Ltd., followed by being cleaned while being stirred for 2 hours at 50 degrees Celsius. Thereafter, polymer component(s) adhered to a part of the surface of the electroforming body was(were) removed by repeating the following process three times. That is, an acrylic-based UV curable resin was applied on the nickel electroforming body; and the applied acrylic-based UV curable resin was cured; and then the cured resin was peeled off (see FIG. 2H).

Subsequently, the nickel electroforming body was immersed in HD-2101TH manufactured by Daikin Chemicals Sales, Co., Ltd. for about 1 minute and was dried, and then stationarily placed overnight. The next day, the nickel electroforming body was immersed in HDTH manufactured by Daikin Chemicals Sales, Co., Ltd. to perform an ultrasonic cleaning process for about 1 minute. Accordingly, a nickel mold (nickel substrate) for which a mold-release treatment had been performed was obtained (see FIG. 3A).

Subsequently, a fluorine-based UV curable resin was applied on a PET substrate (COSMOSHINE A-4100 manufactured by Toyobo Co., Ltd.). Then, the fluorine-based UV curable resin was cured by irradiation with ultraviolet rays at 600 mJ/cm$^2$, with the obtained nickel mold being pressed to the PET substrate (see FIG. 3B). After curing of the resin, the nickel mold was peeled off from the cured resin (see FIG. 3C). Accordingly, a diffraction grating made of the PET substrate with the resin film to which the surface profile of the nickel mold was transferred was obtained.

Figure 9:
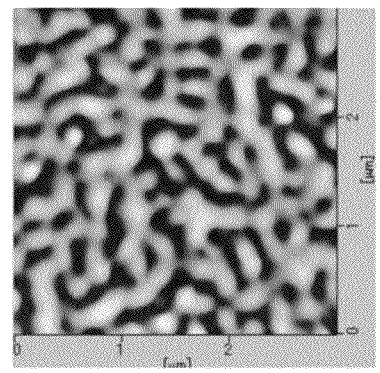
FIG. 9 shows a concavity and convexity analysis image, which was obtained by use of an atomic force microscope, of a surface of a resin of a diffraction-grating substrate manufactured in Example 1.

An analysis image of the concavity and convexity shape on the surface of the resin in the diffraction grating was obtained by using an atomic force microscope (a scanning probe microscope equipped with an environment control unit "Nanonavi II Station/E-sweep" manufactured by SIT Nano-Technology Inc.). Analysis conditions of the atomic force microscope were as follows. Measurement mode: dynamic force mode Cantilever: SI-DF40 (material: Si, lever width: 40 μm, diameter of tip of chip: 10 nm)
Measurement atmosphere: in air
Measurement temperature: 25 degrees Celsius FIG. 9 shows a concavity and convexity analysis image of the surface of the resin of the obtained diffraction grating.
<Average Height of Concavities and Convexities>

A concavity and convexity analysis image was obtained as described above by performing a measurement in a randomly selected measuring region of 3 μm square (length: 3 μm, width: 3 μm) in the diffraction grating. Distances between randomly selected concave portions and convex portions in the depth direction were measured at 100 points or more in the concavity and convexity analysis image, and the average of the distances was calculated as the average height (depth) of the concavities and convexities. The average height of the concavity and convexity pattern obtained by the analysis image in this example was 62 nm.
<Fourier-Transformed Image>

Figure 10:
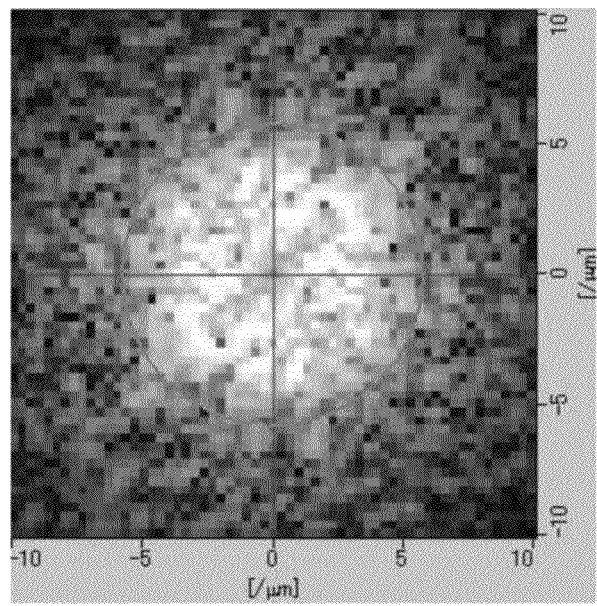
FIG. 10 shows a Fourier-transformed image obtained from the concavity and convexity analysis image, which was obtained by use of the atomic force microscope, of the surface of the resin of the diffraction-grating substrate manufactured in Example 1.

A concavity and convexity analysis image was obtained as described above by performing a measurement in a randomly selected measuring region of 3 μm square (length: 3 μm, width: 3 μm) in the diffraction grating. The obtained concavity and convexity analysis image was subjected to a flattening process including primary inclination correction, and then to two-dimensional fast Fourier transform processing. Thus, a Fourier-transformed image was obtained. FIG. 10 shows the obtained Fourier-transformed image. As is clear from the result shown in FIG. 10, it was confirmed that the Fourier-transformed image showed a circular pattern substantially centered at an origin at which an absolute value of wavenumber was 0 μm$^{-1}$, and that the circular pattern was present within a region where the absolute value of wavenumber was within a range of 10 μm$^{-1}$ or less.

The circular pattern of the Fourier-transformed image is a pattern observed due to gathering of bright spots in the Fourier-transformed image. The term "circular" herein means that the pattern of the gathering of the bright spots looks like a substantially circular shape, and is a concept further including a case where a part of a contour looks like a convex shape or a concave shape. The gathering of the bright spots may look like a substantially annular shape, and this case is expressed as the term "annular". It is noted that the term "annular" is a concept further including a case where a shape of an outer circle or inner circle of the ring looks like a substantially circular shape and further including a case where a part of the contours of the outer circle and/or the inner circle of the ring looks like a convex shape or a concave shape. Further, the phrase "the circular or annular pattern is present within a region where an absolute value of wavenumber is within a range of 10 μm$^{-1}$ or less (more preferably from 1.25 to 10 μm$^{-1}$, further preferably from 1.25 to 5 μm$^{-1}$)" means that 30% or more (more preferably 50% or more, further more preferably 80% or more, and particularly preferably 90% or more) of bright spots forming the Fourier-transformed image are present within a region where the absolute value of wavenumber is within a range of 10 μm$^{-1}$ or less (more preferably from 1.25 to 10 μm$^{-1}$, and further preferably from 1.25 to 5 μm$^{-1}$). Regarding a relation between the pattern of the concavity and convexity structure and the Fourier-transformed image, the followings have been appreciated. That is, in a case that the concavity and convexity structure itself has neither the pitch distribution nor the directivity, the Fourier-transformed image appears to have a random pattern (no pattern). In a case that the concavity and convexity structure is entirely isotropic in an XY direction and has the pitch distribution, a circular or annular Fourier-transformed image appears. In a case that the concavity and convexity structure has a single pitch, the annular shape appeared in the Fourier-transformed image tends to be sharp.

The two-dimensional fast Fourier transform processing on the concavity and convexity analysis image can be easily performed by electronic image processing using a computer equipped with software for two-dimensional fast Fourier transform processing.

As a result of the image analysis of the obtained Fourier-transformed image, the wavenumber 2.38 μm$^{-1}$ was the most intensive. That is, the average pitch was 420 nm. The average pitch could be obtained as follows. For each of the points of Fourier-transformed image, intensity and distance (unit: μm$^{-1}$) from the origin of Fourier-transformed image were obtained. Then, the average value of the intensity was obtained for the points each having the same distance from the origin. As described above, a relation between the distance from the origin of the Fourier-transformed image and the average value of the intensity was plotted, a fitting with a spline function was carried out, and the wavenumber of peak intensity was regarded as the average wavenumber (μm$^{-1}$). For the average pitch, it is allowable to make a calculation by another method, for example, a method for obtaining the average pitch of the concavities and convexities as follows. That is, a concavity and convexity analysis image is obtained by performing a measurement in a randomly selected measuring region of 3 μm square (length: 3 μm, width: 3 μm) in the diffraction grating, then the distances between randomly selected adjacent convex portions or between randomly selected adjacent concave portions are measured at 100 points or more in the concavity and convexity analysis image, and then an average of these distances is determined.

The apparatus shown in FIG. 6 was provided in a dark room to observe the intensity distribution of scattered light of the substrate obtained as described above under the following conditions. The height of the pair of black blocks in a rectangular parallelepiped shape of the stage device 104 was 40 mm; the distance between the pair of black blocks was 27 mm; a square substrate of 30 mm×30 mm was provided as the substrate; a pair of highly directional LED bar illuminations (produced by CCS Inc., LDL2-119 x 16BL) having a light-emission central wavelength of 470 nm and an area of light-emitting section of 119 mm×160 mm was provided at a position having a height of 160 mm from the floor surface; the pair of LED bar illuminations was provided to be inclined toward the floor surface at 10° from a horizontal state, and to set the distance between the two LED bar illuminations to 307 mm; a digital camera was used as the imaging element 124 and arranged at a position having a distance of 770 mm from the surface of the substrate; and light emission of the pair of LED bar illuminations was performed at a maximum output (each 5.7 W) and an image of the substrate was obtained. The type of the digital camera and the imaging conditions were as follows:

Camera: Canon EOS Kiss X3
Lens: EF-S18-55 mm F3. 5-5. 6 IS
Shutter speed: 1/100 seconds
ISO sensitivity: 3200
Aperture value: F5.6
White balance: Standard
Picture style: Standard
Pixel value: 0 to 255

Figure 11A:
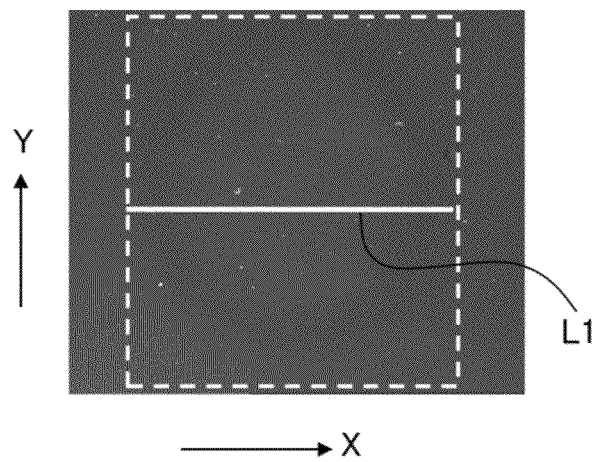
FIG. 11A is a photograph showing an image from a surface of the substrate observed in Example 1.
Figure 11B:
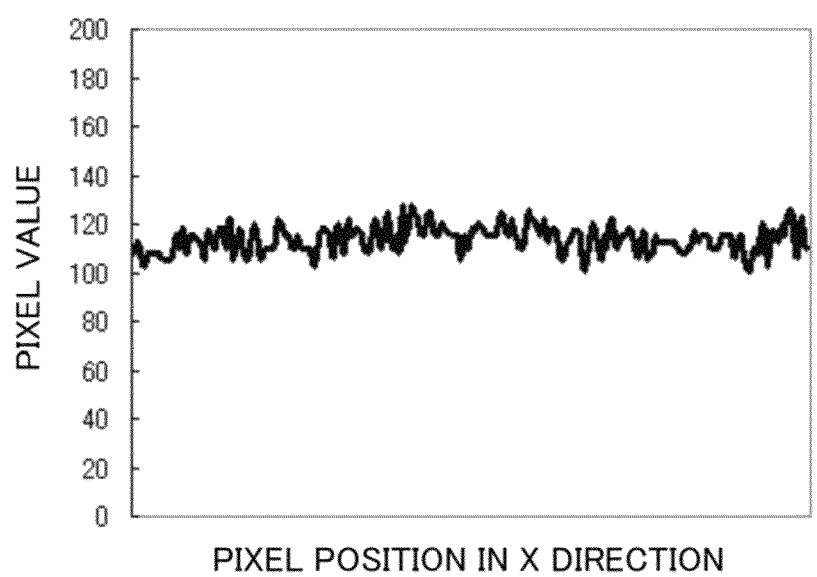
FIG. 11B is a graph showing profile of pixel positions on the line L1 in the photograph of FIG. 11A and pixel values at the pixel positions.

Blue pixel values were sampled or extracted from the image obtained by the digital camera, and the blue pixel values were displayed as a gray scale. Further, as shown in FIG. 11A, only the pixel values on a line L1, which extended in an X direction at a substantially central position of the image in a Y direction, were sampled to be outputted as profile of the pixel values with respect to pixel positions in the X direction. Only the pixel values in the portion to be made into the organic EL element (within the frame depicted by broken lines in FIG. 11A) as will be described later was outputted as the cross-section profile. FIG. 11B shows profile of the obtained pixel values with respect to the pixel positions in the X direction. The average pixel value was 113; the maximum pixel value was 128; and the minimum pixel value was 100. From these values, it was appreciated that the maximum pixel value/minimum pixel value was 1.28, which was less than 1.5 as a judgment reference value.

Subsequently, on the resin layer of the obtained diffraction grating, a transparent electrode (ITO, thickness: 120 nm) was stacked by a sputtering method, and a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 150 nm) were each stacked by a vapor deposition method so that the shape of the concavities and convexities formed on the surface of the cured resin layer is maintained. Accordingly, the organic EL element was obtained. A direct-current power supply was connected to the obtained organic EL element such that negative voltage was applied on the metal electrode side and positive voltage was applied on the transparent electrode side. Then, the voltage of 3V was applied and the image of the light emission state of the organic EL element was obtained by the digital camera. The central wavelength of the light emission of the organic EL element was 520 nm. The imaging conditions of the digital camera were similar to the imaging conditions of the digital camera used for the substrate imaging, except that the shutter speed was changed to 1/1600 seconds.

Figure 12A:
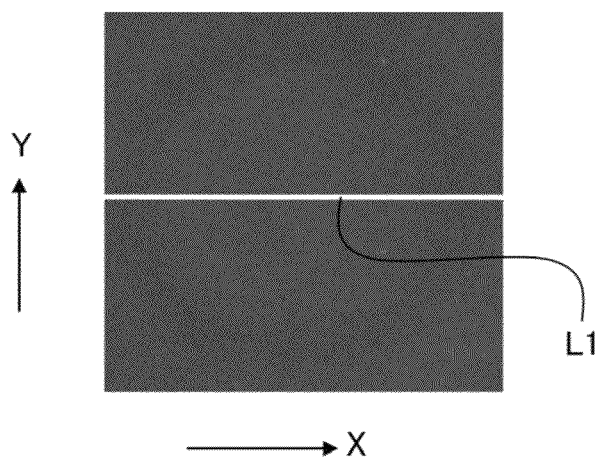
FIG. 12A is a photograph showing an image from the surface of the substrate observed in Example 1.
Figure 12B:
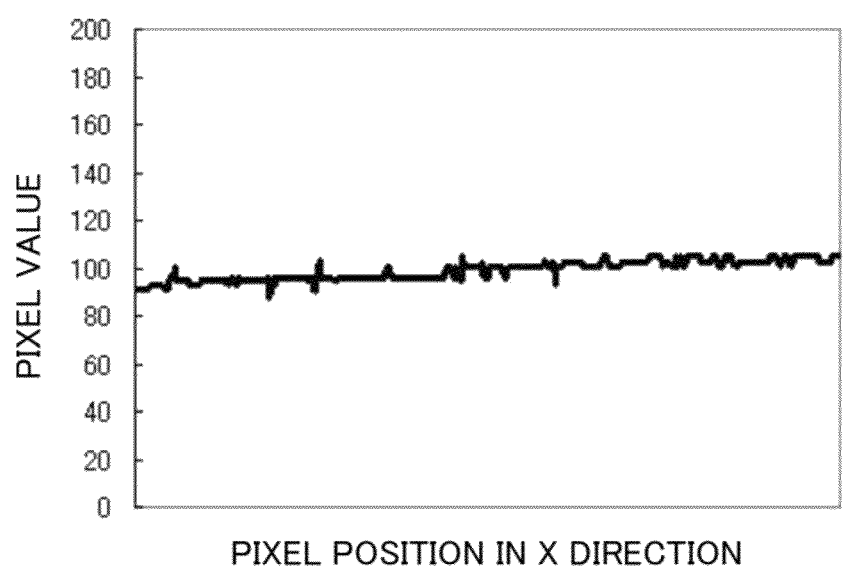
FIG. 12B is a graph showing profile of pixel positions on the line L1 in the photograph of FIG. 12A and pixel values at the pixel positions.

Green pixel values were sampled or extracted from the image obtained by the digital camera, and the green pixel values were displayed as a gray scale. As shown in FIG. 12A, only the pixel values on a line L1 (position which is the same as the line L1 on the substrate), which extended in an X direction at a substantially central position of the image in a Y direction, were sampled to be outputted as profile of the pixel values with respect to pixel positions in the X direction. FIG. 12B shows profile of the obtained pixel values with respect to the pixel positions in the X direction. The average pixel value was 99; the maximum pixel value was 105; and the minimum pixel value was 89. From these values, it was appreciated that the maximum pixel value/minimum pixel value was 1.18, which was less than 1.5 as the judgment reference value. Further, it was appreciated that the profile shown in FIG. 12B had a tendency which was approximately consistent with that of the profile shown in FIG. 11B and that the distribution of scattered light on the substrate reflected the distribution of scattered light on the organic EL element. Accordingly, it is found out that light-emitting property (unevenness of luminance) of the organic EL element can be known in advance by performing the inspection and evaluation of the scattered light on the diffraction-grating substrate before inspecting the unevenness of luminance of the completed organic EL element in the manufacturing process of the organic EL element. As described above, it is possible to produce the organic EL element with a high throughput by associating property of the unevenness of luminance of the organic EL element with property of the unevenness of luminance of the substrate having the irregular concave and convex surface which is used in the organic EL element. Especially, since prediction of occurrence of the unevenness of luminance of the completed organic EL element and evaluation of the completed organic EL element can be performed in the production step of the substrate, it is possible to further reliably produce the organic EL element having a uniform illumination intensity by excluding a substrate which was determined to be unsatisfactory or defective in the judgment of the unevenness of luminance and using only a substrate which passed or was determined to be satisfactory or acceptable in the judgment of the unevenness of luminance.

Example 2

In this Example, a substrate having a concave and convex surface is produced by BKL method, and then an organic EL element is produced by using the produced substrate. First, a silicone-based polymer (a resin composition of a mixture of 90% by mass of a silicone rubber (manufactured by Wacker Chemie AG under the product name of "Elastosil RT601") and 10% by mass of a curing agent) was applied onto a base member (material: glass, size: 20 mm×12 mm) by a spin coating method, and cured by being heated at 100 degrees Celsius for 1 hour. Accordingly, a silicone-based polymer film was formed.

Next, an aluminum vapor-deposited film (thickness: 10 nm) was formed on the silicone-based polymer film by a vapor deposition method under conditions of a temperature of 100 degrees Celsius and a pressure of $1\times10^{-3}$ Pa. Then, after cooling to room temperature (25 degrees Celsius) over a period of 30 minutes, the pressure was returned to the atmospheric pressure ($1.013\times10^5$ Pa). Consequently, concavities and convexities were formed on the surface of the aluminum vapor-deposited film formed on the silicone-based polymer film. Subsequently, a silicone-based polymer (a resin composition of a mixture of 90% by mass of a silicone rubber (manufactured by Wacker Chemie AG under the product name of "Elastosil RT601") and 10% by mass of a curing agent) was applied onto the aluminum vapor-deposited film by a dropping method, then cured by being heated at 100 degrees Celsius for 1 hour, and thereafter detached from the aluminum vapor-deposited film. Thus, Master Block (M-1B) was obtained.

Then, an aluminum vapor-deposited film (thickness: 10 nm) was formed on the obtained Master Block (M-1B) by a vapor deposition method under conditions of a temperature of 100 degrees Celsius and a pressure of $1\times10^{-3}$ Pa. After cooling to room temperature (25 degrees Celsius) over a period of 30 minutes, the pressure was returned to the atmospheric pressure ($1.013\times10^5$ Pa). Consequently, concavities and convexities were formed on the surface of the aluminum vapor-deposited film formed on the Master Block (M-1B). Subsequently, a silicone-based polymer (a resin composition of a mixture of 90% by mass of a silicone rubber (manufactured by Wacker Chemie AG under the product name of "Elastosil RT601") and 10% by mass of a curing agent) was applied onto the aluminum vapor-deposited film by a dropping method, then cured by being heated at 100 degrees Celsius for 1 hour, and thereafter detached from the aluminum vapor-deposited film. Thus, Master Block (M-2B) was obtained. Further, an aluminum vapor-deposited film (thickness: 10 nm) was formed on the Master Block (M-2B) having concavities and convexities formed on the surface thereof by a vapor deposition method under conditions of a temperature of 100 degrees Celsius and a pressure of $1\times10^{-3}$ Pa. Then, after cooling to room temperature (25 degrees Celsius) over a period of 30 minutes, the pressure was returned to the atmospheric pressure ($1.013\times10^5$ Pa). Consequently, concavities and convexities were formed on the surface of the aluminum vapor-deposited film formed on the Master Block (M-2B). Subsequently, a silicone-based polymer (a resin composition of a mixture of 90% by mass of a silicone rubber (manufactured by Wacker Chemie AG under the product name of "Elastosil RT601") and 10% by mass of a curing agent) was applied onto the aluminum vapor-deposited film by a dropping method, then cured by being heated at 100 degrees Celsius for 1 hour, and thereafter detached from the aluminum vapor-deposited film. Thus, Master Block (M-3B) was obtained.

(i) Manufacture of Diffraction Grating

Figure 13:
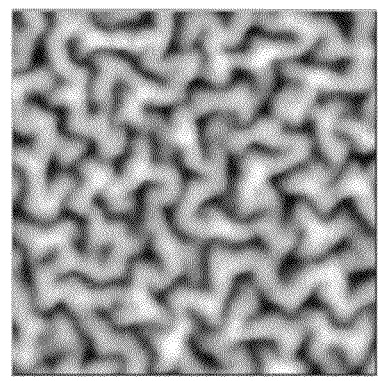
FIG. 13 shows a concavity and convexity analysis image, which was obtained by use of the atomic force microscope, of a surface of a resin of a diffraction-grating substrate manufactured in Example 2.

A glass substrate of 50 mm×50 mm (produced by Matsunami glass Ind. Ltd., product name "Micro slide glass") and a curable resin (Produced by Norland Products Inc., product name "NOA 61") were prepared and the curable resin was applied onto the glass substrate. Then, the curable resin was cured by irradiation with ultraviolet rays for 1 hour while the Master Block (M-3B) was pressed against the curable resin in a step-and-repeat-manner twice in each of the horizontal direction and vertical direction so as to obtain a diffraction grating having a cured resin layer in which concavities and convexities were formed in an area of 40 mm×24 mm positioned at the substantially central portion of a glass substrate. Reference can be made, for example, to Jun TANIGUCHI "Hajimete no nano-imprint gijutsu (Introduction to nano-imprint technology)" Beginner's book 38, p 51, published by Kogyo Chosakai Publishing Inc., about details of this process. A concavity and convexity analysis image of the surface of the resin of the obtained diffraction grating is obtained by use of the atomic force microscope used in Example 1, and the concavity and convexity analysis image is shown in FIG. 13. The observation and analysis conditions by the atomic force microscope are similar to those in Example 1.

<Average Height of Concavities and Convexities>

A concavity and convexity analysis image was obtained as described above by performing a measurement in a randomly selected measuring region of 3 µm square (length: 3 µm, width: 3 µm) in the diffraction grating. Distances between randomly selected concave portions and convex portions in the depth direction were measured at 100 points or more in the concavity and convexity analysis image, and the average of the distances was calculated as the average height (depth) of the concavities and convexities. The average height of the concavity and convexity pattern obtained by the analysis image in this example was 35 nm.

<Fourier-Transformed Image>

Figure 14:
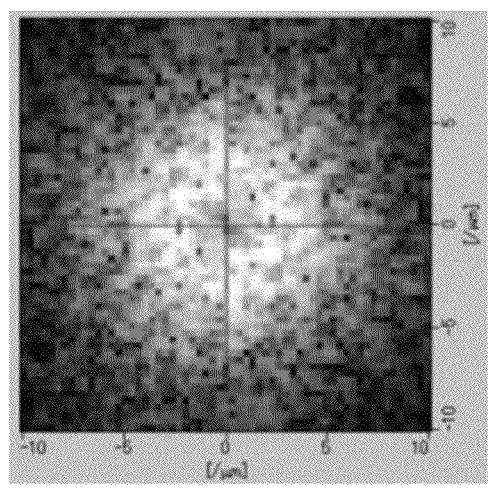
FIG. 14 shows a Fourier-transformed image obtained from the concavity and convexity analysis image, which was obtained by use of the atomic force microscope, of the surface of the resin of the diffraction-grating substrate manufactured in Example 2.

A concavity and convexity analysis image was obtained as described above by performing a measurement in a randomly selected measuring region of 3 µm square (length: 3 µm, width: 3 µm) in the diffraction grating. The obtained concavity and convexity analysis image was subjected to a flattening process including primary inclination correction, and then to two-dimensional fast Fourier transform processing. Thus, a Fourier-transformed image was obtained. FIG. 14 shows the obtained Fourier-transformed image. As is clear from the result shown in FIG. 14, it was confirmed that the Fourier-transformed image showed a circular pattern substantially centered at an origin at which an absolute value of wavenumber was 0 µm$^{-1}$, and that the circular pattern was present within a region where the absolute value of wavenumber was within a range of 10 µm$^{-1}$ or less.

As a result of the image analysis of the obtained Fourier-transformed image, the wavenumber 2.67 µm$^{-1}$ was the most intensive. That is, the average pitch was 375 nm.

The intensity distribution of the scattered light on the substrate obtained as described above was observed using the apparatus shown in FIG. 6 under the same conditions as Example 1, except that the size of a glass substrate used in this Example was different from that used in Example 1. The glass was arranged so that the center of the area in which the concavities and convexities were formed was coincident with the center of an area of which image is to be taken. The digital camera used in Example 1 was used in this Example, and imaging conditions in this Example were same as those in Example 1.

Figure 15A:
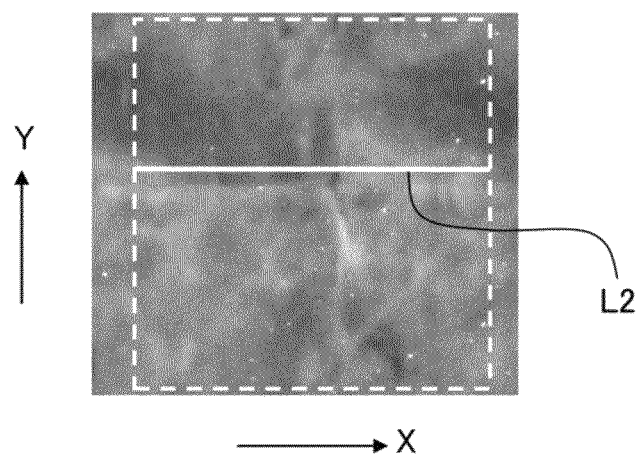
FIG. 15A is a photograph showing an image from a surface of the substrate observed in Example 2.
Figure 15B:
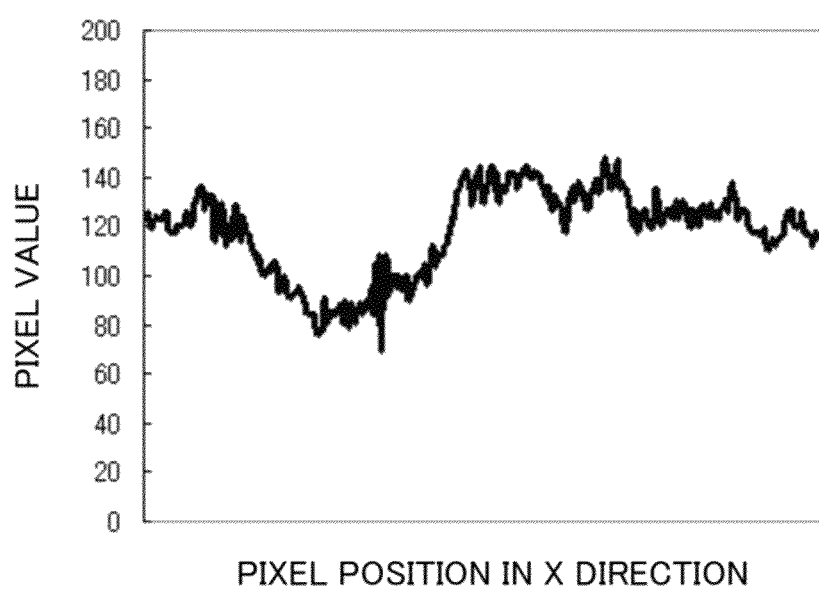
FIG. 15B is a graph showing profile of pixel positions on the line L2 in the photograph of FIG. 15A and pixel values at the pixel positions.

Blue pixel values were sampled or extracted from the image obtained by the digital camera, and the blue pixel values were displayed as a gray scale. Further, as shown in FIG. 15A, only the pixel values on a line L2, which extended in an X direction at a substantially central position of the image in a Y direction, were sampled to be outputted as profile of the pixel values with respect to pixel positions in the X direction. Noted that, FIG. 15A shows an image of only the portion to be made into the organic EL element as will be described later. FIG. 15B shows profile of the obtained pixel values with respect to the pixel positions in the X direction. The average pixel value was 118; the maximum pixel value was 149; and the minimum pixel value was 69. From these values, it was appreciated that the maximum pixel value/minimum pixel value was 2.16, which exceeded 1.5 as the acceptable range.

(ii) Manufacture of Organic EL Element

The difference of scattered intensity of the diffraction-grating substrate obtained as described above exceeded the acceptable value. However, on the cured resin layer of the substrate, a transparent electrode (ITO, thickness: 120 nm) was stacked by a sputtering method and a hole transporting layer (N,N'-diphenyl-N,N'-bis(3-methylphenyl)-1,1'-diphenyl-4,4'-diamine, thickness: 40 nm), an electron transporting layer (8-hydroxyquinoline aluminum, thickness: 30 nm), a lithium fluoride layer (thickness: 1.5 nm), and a metal electrode (aluminum, thickness: 150 nm) were each stacked by a vapor deposition method, so that the shape of the concavities and convexities formed on the surface of the cured resin layer is maintained. Accordingly, the organic EL element was obtained (see FIG. 8). A direct-current power supply was connected to the obtained organic EL element such that negative voltage was applied on the metal electrode side and positive voltage was applied on the transparent electrode side. Then, the voltage of 3V was applied and the image of the light emission state of the organic EL element was obtained by the digital camera. The central wavelength of the light emission of the organic EL element was 520 nm. The imaging conditions of the digital camera were similar to the imaging conditions of the digital camera used for the substrate imaging, except that the shutter speed was changed to 1/1600 seconds.

Figure 16A:
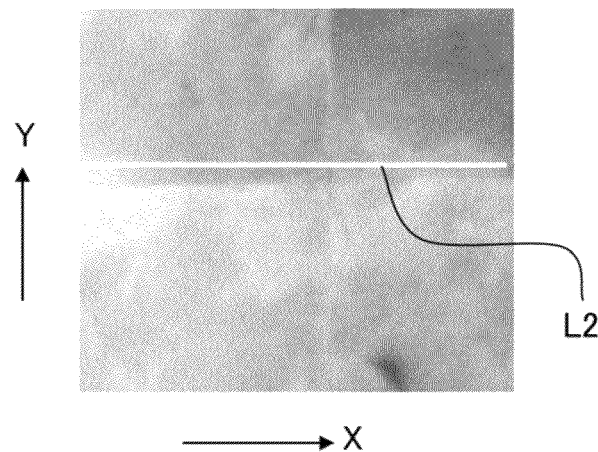
FIG. 16A is a photograph showing an image from the surface of the substrate observed in Example 2.
Figure 16B:
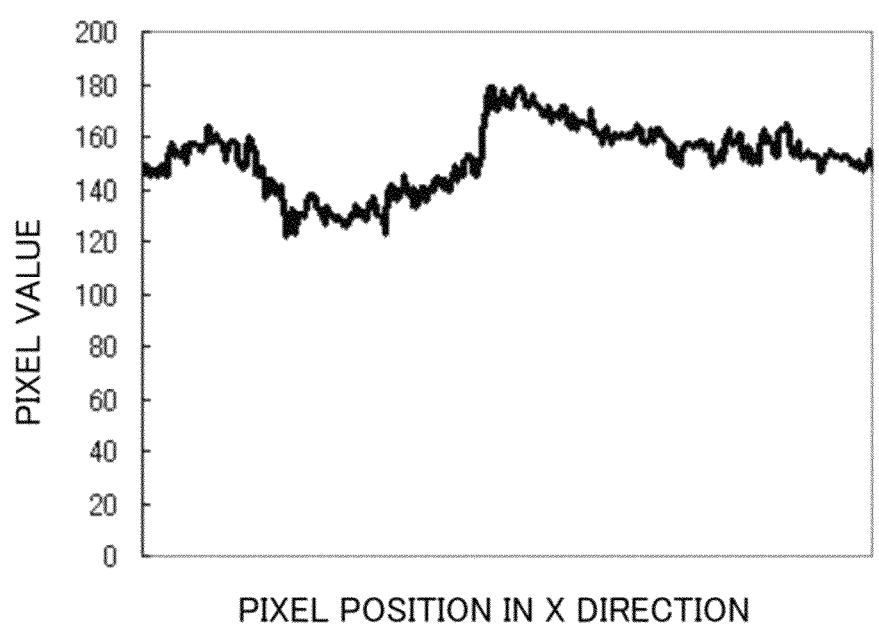
FIG. 16B is a graph showing profile of pixel positions on the line L2 in the photograph of FIG. 16A and pixel values at the pixel positions.

Green pixel values were sampled or extracted from the image obtained by the digital camera, and the green pixel values were displayed as a gray scale. As shown in FIG. 16A, only the pixel values on a line L2 (position which is the same as the line L2 on the substrate), which extended in an X direction at a substantially central position of the image in a Y direction, were sampled to be outputted as profile of the pixel values with respect to pixel positions in the X direction. FIG. 16B shows profile of the obtained pixel values with respect to the pixel positions in the X direction. The average pixel value was 151; the maximum pixel value was 183; and the minimum pixel value was 114. From these values, it was appreciated that the maximum pixel value/minimum pixel value was 1.61, which exceeded 1.5 as the judgment reference value. Further, it was appreciated that the profile shown in FIG. 16B had a tendency which was approximately consistent with that of the profile shown in FIG. 15B and that the distribution of scattered light on the substrate reflected the distribution of scattered light on the organic EL element. Accordingly it is possible to further reliably produce the organic EL element having a uniform illumination intensity by inspecting and evaluating the scattered light on the diffraction-grating substrate before inspecting the unevenness of luminance of the completed organic EL element in the manufacturing process of the organic EL element, then excluding a substrate which does not meet a criterion for the unevenness of luminance, and using only a substrate which meets the criterion for the unevenness of luminance.

Example 3

Figure 19:
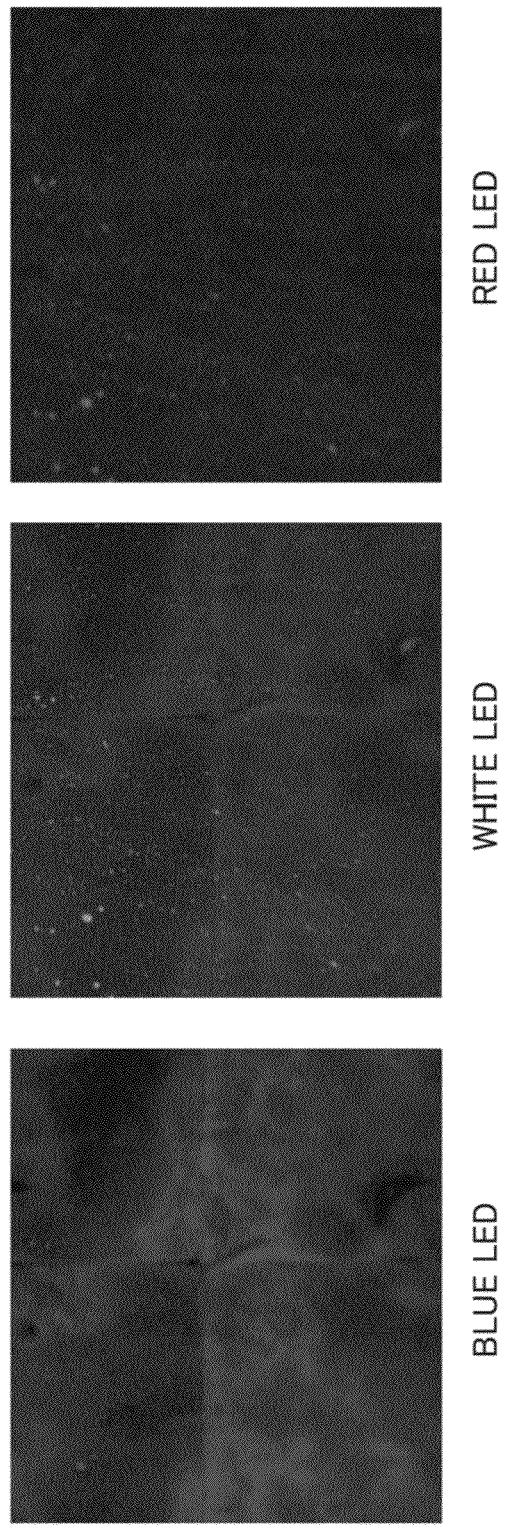
FIG. 19 shows photographs of images of the concave and convex surface of the substrate obtained by using LED bar illuminations having blue LED, white LED, and red LED, respectively.

In Examples 1 and 2, a blue light source having the light-emission central wavelength of 470 nm was used as a light source in the inspection step. In this Example, a white LED and a red LED were used to evaluate visibility of the scattered light on the resin substrate obtained in Example 1. FIG. 19 shows photographs of the images of the concave and convex surface of the substrate obtained by using LED bar illuminations having the blue LED (Example 1), the white LED, and the red LED respectively. In each of the photographs, in a case of using the red LED, the unevenness of pattern (unevenness of luminance) was hardly observed and foreign substances on the resin substrate were emphasized; and in a case of using the while LED an image having an intermediate property or appearance between the property or appearance of the image obtained by using the blue LED and the property or appearance of the image obtained by the red LED, that is, an image in which both the unevenness of pattern and the foreign substances on the resin substrate were emphasized was obtained. As is understood from Examples 1 and 2, since the unevenness of luminance is caused by the unevenness of pattern, the blue light source (for example, the light-emission central wavelength is 430 nm to 485 nm) is preferable as a light source of an inspection system which inspects the unevenness of luminance of the diffraction-grating substrate for the organic EL element which has concavities and convexities of which pitch is, for example, 100 nm to 600 nm.

Example 4

In this example, a nickel mold (nickel substrate), for which a mold-release treatment was performed, was obtained by using the BCP method similar to Example 1. Subsequently, a fluorine-based UV curable resin was applied on a PET substrate (easily-adhesion PET film manufactured by Toyobo Co., Ltd., product name: COSMOSHINE A-4100). Then, the fluorine-based UV curable resin was cured by irradiation with ultraviolet rays at 600 mJ/cm$^2$, with the nickel mold being pressed to the PET substrate. After curing of the resin, the nickel mold was peeled off from the cured resin. Accordingly, a diffraction grating mold made of the PET substrate with the resin film to which the surface profile of the nickel mold was transferred was obtained. Next, 2.5 g of tetraethoxysilane (TEOS) and 2.1 g of methyltriethoxysilane (MTES) were added by drops to a mixture of 24.3 g of ethanol, 2.16 g of water, and 0.0094 g of concentrated hydrochloric acid, followed by being stirred for 2 hours at a temperature of 23 degrees Celsius and humidity of 45% to obtain a sol solution. The sol solution was applied on a soda-lime glass plate of 15×15×0.11 cm by a bar coating. Doctor Blade (manufactured by Yoshimitsu Seiki Co., Ltd.) was used as a bar water. The doctor blade was designed so that the film thickness of the coating film was 5 μm. However, the doctor blade was adjusted so that the film thickness of the coating film was 40 μm by sticking an imide tape having the thickness of 35 μm to the doctor blade. When 60 seconds have elapsed after the application of the sol solution, the diffraction grating mold, made of the PET substrate with the resin film to which the surface profile of the nickel mold was transferred, which was prepared similar to Example 1, was pressed against the coating film on the glass plate by a pressing roll using a method described below.

At first, the surface on which the pattern of the mold has been formed was pressed against the coating film on the glass substrate while rotating the pressing roll of which temperature was 23 degrees Celsius from one end to the other end of the glass substrate. Immediately after completion of the pressing, the substrate was moved on a hot plate and then heated at a temperature of 100 degrees Celsius (pre-sintering). After continuing the heating for 5 minutes, the substrate was removed from the hot plate and the mold was manually peeled off from the substrate from the edge. The mold was peeled off such that an angle (peel angle) of the mold with respect to the substrate was about 30°.

Subsequently, a main sintering was performed by heating the substrate for 60 minutes in an oven of 300 degrees Celsius to obtain a diffraction-grating substrate. Thereafter, the pattern transferred to the coating film was evaluated.

Figure 20A:
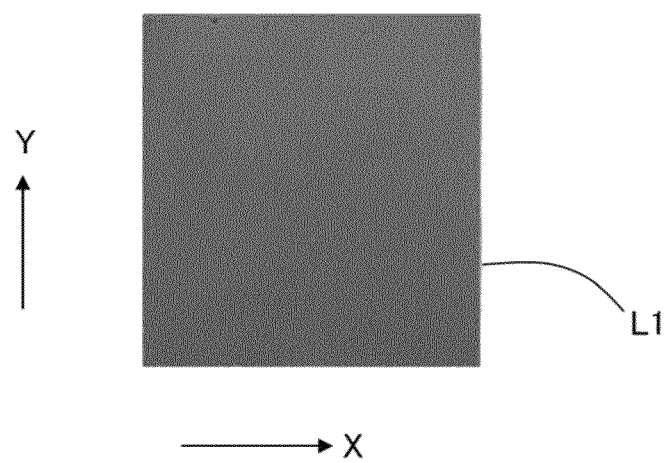
FIG. 20A is a photograph showing an image from the surface of the substrate observed in Example 1.
Figure 20B:
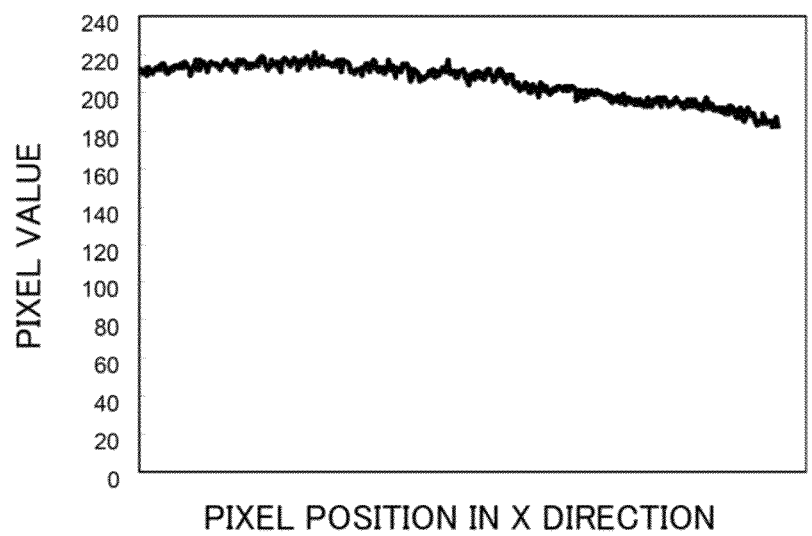
FIG. 20B is a graph showing profile of pixel positions on the line L3 in the photograph of FIG. 20A and pixel values at the pixel positions.

For the diffraction grating, the analysis image of the concavity and convexity shape on the surface was obtained by using the atomic force microscope used in Example 1. Analysis conditions of the atomic force microscope were the same as those in Example 1. A concavity and convexity analysis image was obtained in the similar manner as Example 1 by performing a measurement in a randomly selected measuring region of 3 μm square (length: 3 μm, width: 3 μm) in the diffraction grating. The average height of the concavity and convexity pattern obtained by the analysis image in this example was 56 nm. It was confirmed that the Fourier-transformed image showed a circular pattern substantially centered at an origin at which an absolute value of wavenumber was 0 μm$^{-1}$, and that the circular pattern was present within a region where the absolute value of wavenumber was within a range of 10 µm$^{-1}$ or less. As a result of the image analysis of the obtained Fourier-transformed image, the wavenumber 2.38 µm$^{-1}$ was the most intensive. That is, the average pitch was 420 nm. The intensity distribution of the scattered light on the substrate obtained as described above was observed by using the apparatus shown in FIG. 6 and the same digital camera as Example 1 under the same imaging conditions as Example 1. Blue pixel values were sampled or extracted from the image obtained by the digital camera, and the blue pixel values were displayed as a gray scale. As shown in FIG. 20A, only the pixel values on a line L3, which extended in an X direction at a substantially central position of the image in a Y direction, were sampled to be outputted as profile of the pixel values with respect to pixel positions in the X direction. FIG. 20B shows profile of the obtained pixel values with respect to the pixel positions in the X direction. According to calculations of the average pixel value, the maximum pixel value, and the minimum pixel value depending on the cross-section profile, which is outputted from the image of the digital camera in the similar manner as Example 1, the average pixel value was 205.6; the maximum pixel value was 221.0; and the minimum pixel value was 181.0. From these values, it was appreciated that the maximum pixel value/minimum pixel value was 1.22, which was less than 1.5 as the judgment reference value.

In the above description, the methods of the present invention were explained by Examples. The present invention, however, is no limited thereto, and can be realized in various aspects. Although the substrates were produced by the BCP method and BKL method in the Examples, another method may be used provided that the substrate having the irregular concave and convex surface can be produced. Further, although the substrate for electroforming, the metal substrate (mold) formed by the electroforming, and the resin substrate formed from the metal substrate each has a flat plate shape in the Examples, each of the substrates may have a curved shape. For example, the metal substrate may be formed as a drum having a concavity and convexity pattern by forming the metal substrate to have a drum shape by the electroforming. Further, in the Examples, the intensity of the scattered light on each of the produced substrate and the produced organic EL element using the produced substrate was measured and evaluated by using the apparatus shown in FIG. 6. The present invention, however, is also applicable to a large-size glass substrate or a film on a roll in which a long film is wound on a core, by providing a line sensor camera at the upper portion of a film transport system and monitoring the intensity of the scattered light.

Further, the substrate for which the inspection step and evaluation/judgment step were performed was the resin substrate molded by using the metal substrate formed by the electroforming in the BCP method in each of the Examples. However, it is possible to inspect a substrate obtained at any stage (any process step), provided that the substrate has the irregular concave and convex surface which is formed in order to produce the resin substrate. For example, the substrate before the second heating step in the BCP method (see FIG. 2C), the substrate having a concave and convex surface in a shape of chevrons obtained in the second heating step (see FIG. 2D and FIG. 2E), and the metal substrate having a concave and convex surface obtained in the electroforming step (see FIG. 2H) can be also subjected to the inspection step and subsequent steps. Further, the resin substrate molded by using the metal substrate; the resin substrate which is directly obtained by performing a transfer in which the resin substrate molded by using the metal substrate is used as the master block or the resin substrate which is indirectly obtained by repeating the transfer in which the resin substrate molded by using the metal substrate is used as the master block; and the substrate including a sol-gel material can be also subjected to the inspection step and subsequent steps. Also for the BKL method, the substrate having the concave and convex surface obtained at any stage at which the concavities and convexities have been formed (see, for example, FIG. 5B) can be subjected to the inspection step and subsequent steps. Further, the substrate which is directly or indirectly obtained by performing the transfer by use of the master block of the polymer film obtained by the BKL method and the substrate including the sol-gel material can be also subjected to the inspection step and subsequent steps.

In a case that the substrate and the organic EL element are continuously produced by using the drum (roll) having the concavities and convexities formed by the electroforming as described above in order to enable mass production, it is possible to perform an in-line evaluation as follows. For example, in a substrate production line facility 250 shown in FIG. 17, a film 131 to which a UV curable resin has been applied is fed to a Ni (nickel) roll for transfer 136 via an intermediate roller 142, the UV curable resin is cured by a UV light irradiated from a UV radiation device 133 provided in the vicinity of the Ni (nickel) roll for transfer 136 while a concavity and convexity pattern is transferred to the UV curable resin by the Ni (nickel) roll for transfer 136, and thereby molding a transferred film 141 continuously. The molded portion of the transferred film 141 is fed to a downstream side via an intermediate roller 144, the molded portion is illuminated with an incident light 146 from an illumination for inspection 132 provided on the downstream of a transport line in order to observe the unevenness of the concavity and convexity shape, and the intensity of the diffracted light/scattered light is measured by a line sensor camera 134 provided to face the transferred film 141. The transferred film 141 is fed by being wound on a winder 138. Accordingly, in the substrate production line facility 250, a predetermined portion of the transferred film 141 is continuously inspected while the concavity and convexity pattern is transferred continuously, and thereby making it possible to judge quality of the transferred film 141.

Figure 17:
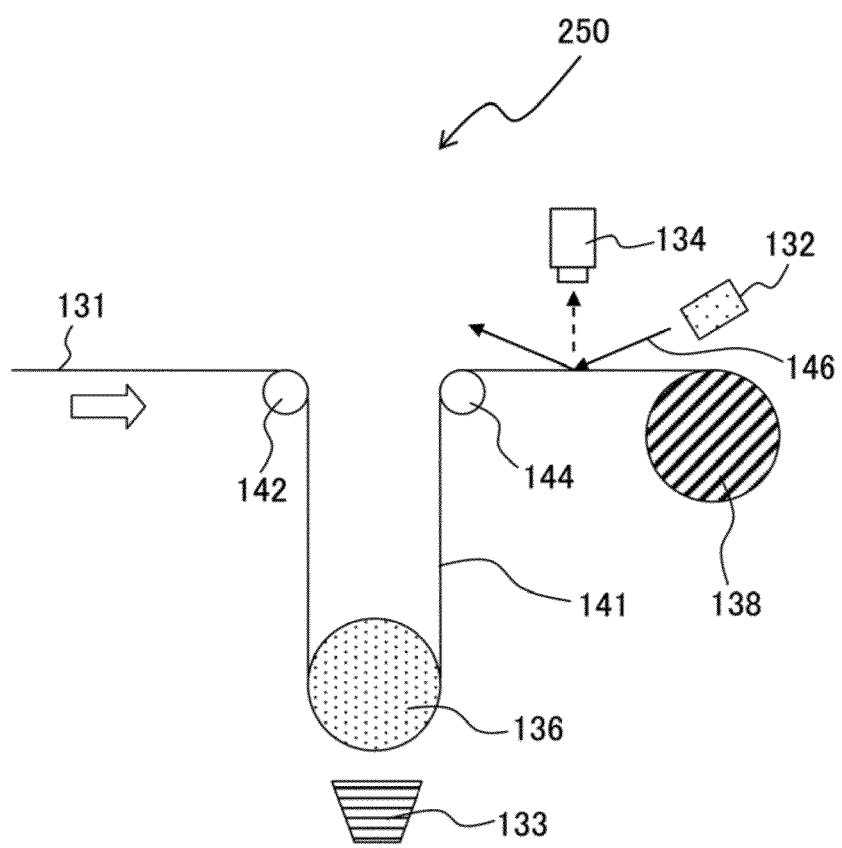
FIG. 17 illustrates an outline of continuous molding and inspection line of a film-shaped substrate.
Figure 18:
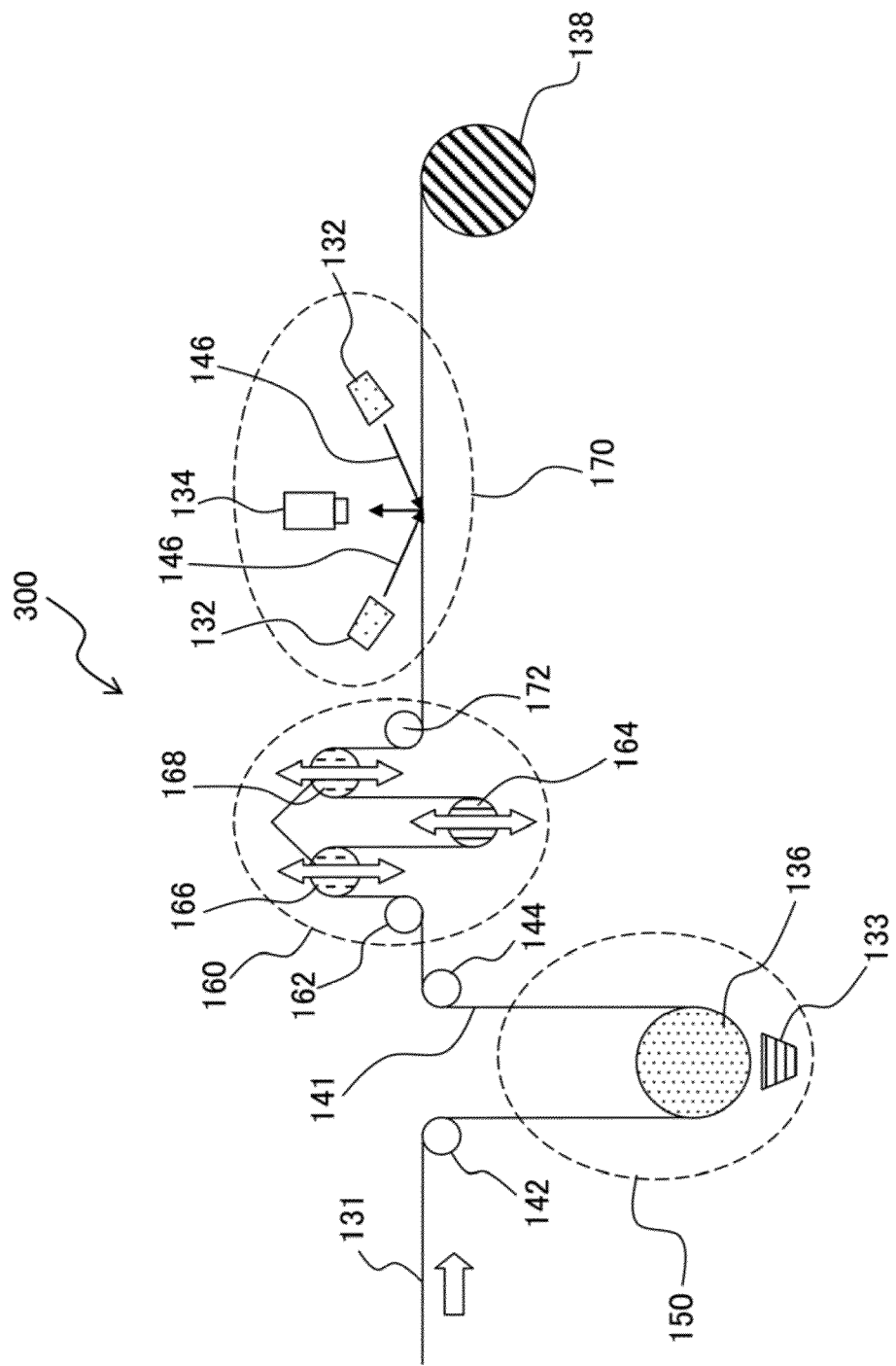
FIG. 18 illustrates another outline of the continuous molding and inspection line of the film-shaped substrate.

FIG. 18 shows a substrate production line facility 300 which is a modification of the substrate production line facility 250 shown in FIG. 17. In a transferring section 150, a UV curable resin applied on a film 131 is cured by a UV light irradiated from a UV radiation device 133, which is provided to face a Ni (nickel) roll for transfer 136 with the film 131 intervening therebetween, while a concavity and convexity shape is transferred to the UV curable resin by the Ni (nickel) roll for transfer 136, and thereby molding a transferred film 141 continuously. In an inspection section 170 on the downstream side in a transport direction, a pair of illuminations for inspection 132 and an area camera (or a two-dimensional luminance colorimeter) 134 which measures intensity distribution of the diffracted light/scattered light of incident lights 146 emitted from the pair of illuminations for inspection 132 are provided. Although the film 141 is transported continuously in the transferring section 150, a film accumulation mechanism 160 is provided between the transferring section 150 and the inspection section 170 so as to transport the film 141 intermittently in the inspection section 170. The film accumulation mechanism 160 includes, for example, upper up-and-down rolls 166, 168, a lower up-and-down roll 164, and intermediate rollers 162, 172. By moving the upper up-and-down rolls 166, 168 and the lower up-and-down roll 164 in an up-down direction appropriately, the film 141 to be fed from the film accumulation mechanism 160 can be stopped intermittently.

In the Examples, the intensity of scattered light was measured and the unevenness of luminance was observed in the inspection step. However, it is possible to evaluate uniformity of chromaticity of the organic EL element based on the evaluation of the uniformity of the concavity and convexity pattern of the substrate. In this case, it is possible to use the two-dimensional luminance colorimeter as an imaging element.

In the Examples, the production of the substrate for the organic EL element was explained. The present invention, however, is not limited thereto, and is applicable to production of a substrate having a concave and convex surface used in a solar cell. It is considered that the substrate having the concavity and convexity structure has a function to change a travelling direction of sunlight, which is from the front of a solar panel, to a lateral direction. Thus, it is possible to perform prediction and evaluation of in-plane distribution of conversion efficiency of the solar cell in the inspection step and evaluation/judgment step.

According to the present invention, it is possible to efficiently produce a substrate having an irregular concave and convex surface used for a device such as an organic EL element while performing an inspection of unevenness of luminance. In a case that an organic EL element which includes a diffraction-grating substrate having the irregular concave and convex surface is produced, prediction of occurrence of unevenness of luminance of a completed organic EL element and evaluation of the completed organic EL element can be performed at a manufacturing stage of the substrate by associating property of the unevenness of luminance of the organic EL element with property of the unevenness of luminance of the substrate having the irregular concave and convex surface which is used in the organic EL element. Thus, it is possible to further reliably produce the organic EL element having a uniform illumination intensity with a high throughput by excluding a substrate which was determined to be unsatisfactory or defective in the judgment of the unevenness of luminance and using only a substrate which passed the judgment of the unevenness of luminance. Further, even when the uniformity of the illumination intensity of the organic EL element is judged as unsatisfactory, since it can be determined whether the defect occurred at a substrate formation stage or a formation stage of the element itself, it is possible to cope with such a situation rapidly.

What is claimed is:

1. A method for producing a substrate laving an irregular concave and convex surface for scattering light, comprising:
    manufacturing the substrate having the irregular concave and convex surface;
    irradiating the concave and convex surface of the manufactured substrate, which is arranged on a stage formed of a pair of blocks arranged on a floor surface at a predetermined distance, with inspection light from a direction oblique to a normal direction of the concave and convex surface by use of a pair of light sources which is arranged obliquely above the stage at positions symmetrical with the center of the stage, and detecting a returning light of the inspection light returned from the concave and convex surface by an imaging element, which is provided in the normal direction of the concave and convex surface and is arranged above the center of the stage at a predetermined distance from the stage; and
    judging unevenness of luminance of the concave and convex surface based on light intensity of the received returning light by use of an image processing device connected to the imaging element;
    wherein an incident angle of the inspection light to the concave and convex surface is fixed as a predetermined angle while irradiating the inspection light and detecting the returning light.

2. The method for producing the substrate according to claim 1, wherein an average pitch of concavities and convexities of the irregular concave and convex surface on the substrate is within a range from 100 nm to 600 nm, and an average height of the concavities and convexities of the irregular concave and convex surface on the substrate is within a range from 5 nm to 200 nm.

3. The method for producing the substrate according to claim 1, wherein the manufacturing the substrate having the irregular concave and convex surface includes:
    a step of applying a block copolymer solution of a block copolymer made of at least a first polymer and a second polymer on a surface of a base member to form a coating film;
    a step of drying the coating film on the base member; and
    a step of generating a micro phase separation structure of the coating film of the block copolymer solution after the drying.

4. The method for producing the substrate according to claim 3, wherein the step of generating the micro phase separation structure includes a first heating step for heating the coating film after the drying at a temperature higher than a glass transition temperature of the block copolymer; and
    the method for producing the substrate further includes an etching step for etching the coating film after the first heating step to remove the second polymer so that a concavity and convexity structure is formed on the base member.

5. The method for producing the substrate according to claim 4, further comprising a second heating step of heating the concavity and convexity structure, for which the etching has been performed in the etching step, at a temperature higher than a glass transition temperature of the first polymer.

6. The method for producing the substrate according to claim 4, farther comprising:
    a step of forming a seed layer on the concavity and convexity structure after the etching step;
    a step of stacking a metal layer on the seed layer by electroforming; and
    a step of peeling off the base member having the concavity and convexity structure from the metal layer and the seed layer to obtain a metal substrate.

7. The method for producing the substrate according to claim 6, further comprising a second heating step of heating the concavity and convexity structure for which the etching has been performed before the step of forming the seed layer at a temperature higher than a glass transition temperature of the first polymer.

8. The method for producing the substrate according to claim 6, further comprising:
    pressing the obtained metal substrate to a transparent substrate to which a curable resin has been applied;
    curing the curable resin; and
    detaching the metal substrate to obtain the substrate having the irregular concave and convex surface.

9. The method for producing the substrate according to claim 6, further comprising:
    pressing the metal substrate obtained to a substrate to which a curable resin has been applied;
    curing the curable resin;

detaching the metal substrate to form a substrate having a concavity and convexity structure on the substrate;

pressing the substrate having the concavity and convexity structure to a transparent substrate to which a sol-gel material has been applied;

curing the sol-gel material; and detaching the substrate having the concavity and convexity structure to obtain the substrate having the irregular concave and convex surface made of the sol-gel material.

10. The method for producing the substrate according to claim 6, wherein the substrate having the irregular concave and convex surface is made of metal.

11. The method for producing the substrate according to claim 3, wherein the micro phase separation structure has a lamellar form.

12. The method for producing the substrate according to claim 1, wherein the manufacturing the substrate having the irregular concave and convex surface includes:

a step of forming a vapor-deposited film on a surface of a polymer film, which is made of a polymer of which volume changes by heat, under a temperature condition of 70 degrees Celsius or above, and then cooling the polymer film and the vapor-deposited film to form concavities and convexities of wrinkles in a surface of the vapor-deposited film;

a step of attaching a master block material on the vapor-deposited film;

a step of curing the master block material; and a step of detaching the master block material after the curing from the vapor-deposited film to obtain a master block.

13. The method for producing the substrate according to claim 12, wherein the polymer of which volume changes by heat is a silicone-based polymer.

14. The method for producing the substrate according to claim 1, wherein irregular concavities and convexities of the irregular concave and convex surface have a pseudo periodic structure, and in a case that an average period of the concavities and convexities is denoted by d, and that central wavelength of the inspection light is denoted by $\lambda$, the average period d and the central wavelength X satisfy $0.5d \leq \lambda > 2.0d$.

15. The method for producing the substrate according to claim 1, wherein the inspection light is a light of a blue band.

16. The method for producing the substrate according to claim 1, wherein the concave and convex surface is irradiated with the inspection light so that an incident angle $\alpha$, which is oblique to the normal direction of the concave and convex surface, is $30°<\alpha<90°$.

17. The method for producing the substrate according to claim 1, wherein a maximum value and a minimum value of the returning light intensity are obtained from output of each pixel of the imaging element to judge whether or not maximum value/minimum value is less than 1.5.

18. The method for producing the substrate according to claim 1, wherein the substrate having the irregular concave and convex surface is a film-shaped or plate-shaped substrate, and the substrate is irradiated with the inspection light while being moved continuously relative to the inspection light.

19. A method for producing an organic EL element, comprising:

manufacturing a diffraction-grating substrate having it concave and convex surface by using the method for producing the substrate as defined in claim 1; and stacking a transparent electrode, an organic layer, and a metal electrode on the concave and convex surface of the diffraction-grating substrate sequentially to produce the organic EL element.

20. The method for producing the organic EL element according to claim 19, wherein, only in a case that it is judged that unevenness of luminance of the manufactured diffraction-grating substrate is within a predetermined range, the transparent electrode, the organic layer, and the metal electrode are stacked sequentially on the concave and convex surface of the diffraction-grating substrate having the unevenness of luminance within the predetermined range to produce the organic EL element.

21. The method for producing the organic EL element according to claim 20, wherein a maximum value and a minimum value of the returning light intensity are obtained from output of each pixel of the imaging element; and it is judged that the unevenness of luminance of the manufactured diffraction-grating substrate is within the predetermined range in a case that maximum value/minimum value is less than 1.5.

* * * * *

UNITED STATES PATENT AND TRADEMARK OFFICE
CERTIFICATE OF CORRECTION

| | | |
|---|---|---|
| PATENT NO. | : 9,023,668 B2 | Page 1 of 1 |
| APPLICATION NO. | : 14/029371 | |
| DATED | : May 5, 2015 | |
| INVENTOR(S) | : Yusuke Sato et al. | |

It is certified that error appears in the above-identified patent and that said Letters Patent is hereby corrected as shown below:

In the claims,

Column 43, line 1 of claim 1 delete the text beginning with "A method for producing a substrate laving an irregular" and replace with --A method for producing a substrate having an irregular--.

Column 45, line 7 of claim 14 delete the text beginning with "the central wavelength X" and replace with --the central wavelength $\lambda$--.

Signed and Sealed this
Third Day of November, 2015

Michelle K. Lee
*Director of the United States Patent and Trademark Office*